US012702018B2

(12) United States Patent
Lee et al.

(10) Patent No.:  US 12,702,018 B2
(45) Date of Patent:    Aug. 4, 2026

(54) METHOD OF MARKING SEMICONDUCTOR PACKAGE

(71) Applicant: Samsung Electronics Co., Ltd., Suwon-si (KR)

(72) Inventors: Kanggyune Lee, Suwon-si (KR); Sangwon Lee, Suwon-si (KR); Hyeon Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 223 days.

(21) Appl. No.: 18/762,757

(22) Filed: Jul. 3, 2024

(65) Prior Publication Data

US 2025/0096148 A1      Mar. 20, 2025

(30) Foreign Application Priority Data

Sep. 20, 2023    (KR) ......................... 10-2023-0125852

(51) Int. Cl.
*H10W 46/00*       (2026.01)
*H10W 72/00*       (2026.01)
*H10W 74/10*       (2026.01)

(52) U.S. Cl.
CPC .......... *H10W 46/00* (2026.01); *H10W 46/103* (2026.01); *H10W 72/01365* (2026.01); *H10W 72/07331* (2026.01); *H10W 74/111* (2026.01)

(58) Field of Classification Search
CPC .............. H10W 46/00; H10W 46/103; H10W 72/01365; H10W 72/07331; H10W 74/111; H10W 46/401; H10W 46/607; H10W 46/101; H10W 74/117; H10W 74/129; H10P 72/06

See application file for complete search history.

(56) References Cited

U.S. PATENT DOCUMENTS

| | | | |
|---|---|---|---|
| 9,343,434 B2 | 5/2016 | Chen | |
| 9,418,943 B2 | 8/2016 | Kim | |
| 11,362,009 B2 | 6/2022 | Lin et al. | |
| 2001/0035588 A1* | 11/2001 | Aga | ...................... H10W 74/47 |
| | | | 257/E23.179 |

(Continued)

FOREIGN PATENT DOCUMENTS

| | | |
|---|---|---|
| JP | 4853340 B2 | 1/2012 |
| KR | 10-2016-0001169 A | 1/2016 |
| KR | 10-1626823 B1 | 6/2016 |

*Primary Examiner* — George R Koch
*Assistant Examiner* — Christopher C Caillouet
(74) *Attorney, Agent, or Firm* — Fish & Richardson P.C.

(57) ABSTRACT

A method of marking a semiconductor package includes preparing a semiconductor package including a semiconductor chip and a package molding layer surrounding semiconductor chip, attaching a dry film to a top surface of the package molding layer, the dry film being attached to a carrier substrate, forming an ink spot by liquefying a portion of the dry film by radiating laser light to the carrier substrate, forming an ink marking pattern by solidifying the ink spot corresponding to the liquefied portion of the dry film, and removing a remaining portion of the dry film from the top surface of the package molding layer, the remaining portion of the dry film having not been liquefied, wherein the ink marking pattern includes information about storage capacity or information for identifying a producer of a product.

20 Claims, 23 Drawing Sheets

(56)          References Cited

U.S. PATENT DOCUMENTS

2002/0098608  A1*    7/2002   Tandy  ................. H10P 72/0614
                                                           257/E23.179
2009/0148997  A1*    6/2009   Fukuchi  ............... H10W 46/00
                                                           257/E21.347
2011/0315984  A1*   12/2011   Suzuki  ............... H10W 74/121
                                                           438/126
2015/0380359  A1    12/2015   Lim
2023/0048228  A1     2/2023   Lee

* cited by examiner

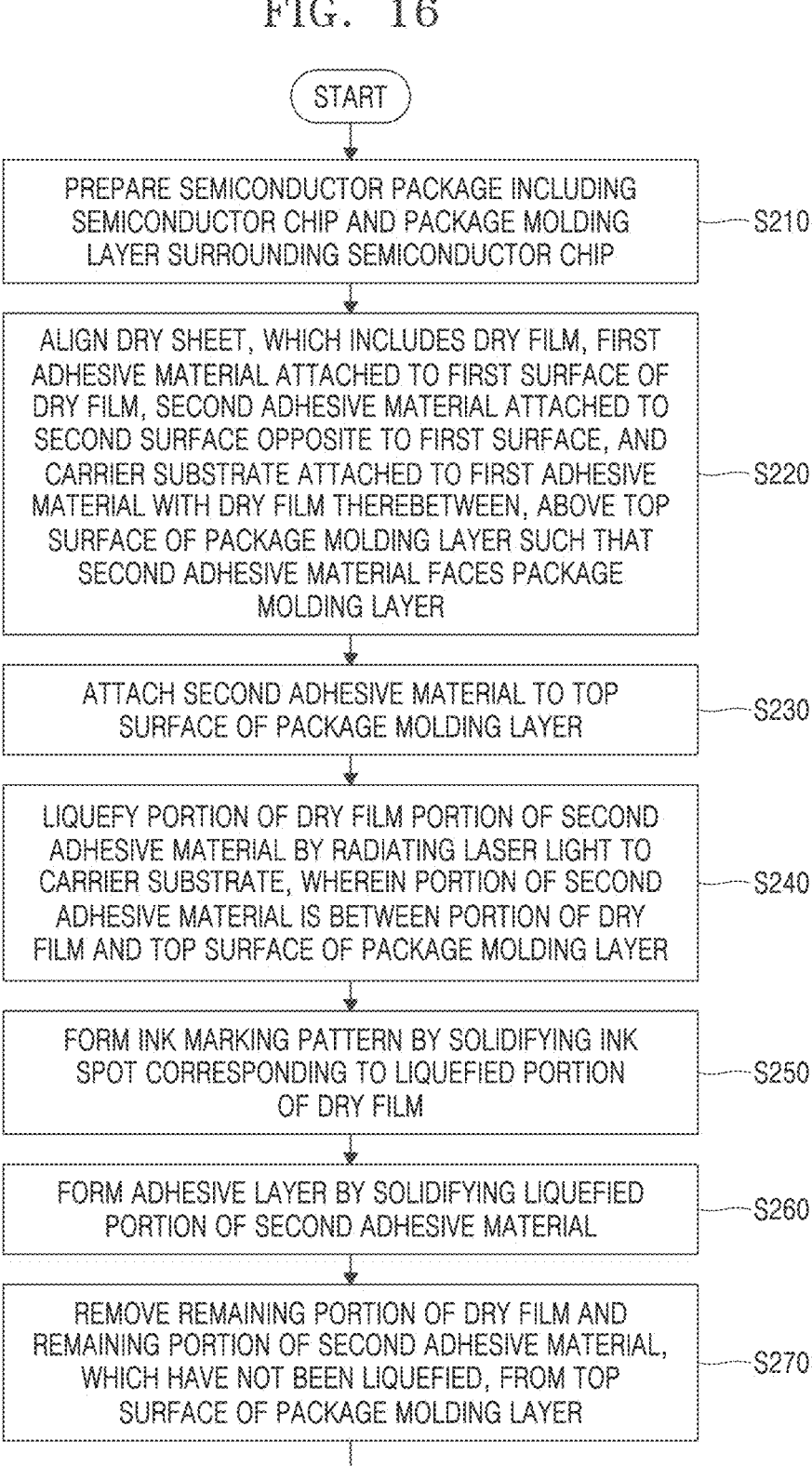

START

PREPARE SEMICONDUCTOR PACKAGE INCLUDING SEMICONDUCTOR CHIP AND PACKAGE MOLDING LAYER SURROUNDING SEMICONDUCTOR CHIP — S210

ALIGN DRY SHEET, WHICH INCLUDES DRY FILM, FIRST ADHESIVE MATERIAL ATTACHED TO FIRST SURFACE OF DRY FILM, SECOND ADHESIVE MATERIAL ATTACHED TO SECOND SURFACE OPPOSITE TO FIRST SURFACE, AND CARRIER SUBSTRATE ATTACHED TO FIRST ADHESIVE MATERIAL WITH DRY FILM THEREBETWEEN, ABOVE TOP SURFACE OF PACKAGE MOLDING LAYER SUCH THAT SECOND ADHESIVE MATERIAL FACES PACKAGE MOLDING LAYER — S220

ATTACH SECOND ADHESIVE MATERIAL TO TOP SURFACE OF PACKAGE MOLDING LAYER — S230

LIQUEFY PORTION OF DRY FILM PORTION OF SECOND ADHESIVE MATERIAL BY RADIATING LASER LIGHT TO CARRIER SUBSTRATE, WHEREIN PORTION OF SECOND ADHESIVE MATERIAL IS BETWEEN PORTION OF DRY FILM AND TOP SURFACE OF PACKAGE MOLDING LAYER — S240

FORM INK MARKING PATTERN BY SOLIDIFYING INK SPOT CORRESPONDING TO LIQUEFIED PORTION OF DRY FILM — S250

FORM ADHESIVE LAYER BY SOLIDIFYING LIQUEFIED PORTION OF SECOND ADHESIVE MATERIAL — S260

REMOVE REMAINING PORTION OF DRY FILM AND REMAINING PORTION OF SECOND ADHESIVE MATERIAL, WHICH HAVE NOT BEEN LIQUEFIED, FROM TOP SURFACE OF PACKAGE MOLDING LAYER — S270

END

METHOD OF MARKING SEMICONDUCTOR PACKAGE

CROSS-REFERENCE TO RELATED APPLICATION

This application is based on and claims priority under 35 U.S.C. § 119 to Korean Patent Application No. 10-2023-0125852, filed on Sep. 20, 2023, in the Korean Intellectual Property Office, the disclosure of which is incorporated by reference herein in its entirety.

BACKGROUND

The inventive concepts relate to a method of marking a semiconductor package, and more particularly, to a method of forming a marking on a molding layer of a semiconductor package.

With the rapid development of the electronics industry and users' needs, electronic devices have become compact and light. With the compactness and lightness of electronic devices, semiconductor packages used in the electronic devices have also been compact and light and required to have high performance, high capacity, and high reliability. For the compactness and lightness of electronic devices, the overall thickness of semiconductor packages is decreasing.

SUMMARY

The inventive concepts provide a method of marking a semiconductor package, thereby providing a thin semiconductor package by forming an identification marking without etching a molding layer of the semiconductor package.

According to an aspect of the inventive concepts, there is provided a method of marking a semiconductor package, the semiconductor package including a semiconductor chip and a package molding layer surrounding the semiconductor chip. The method includes attaching, using a carrier substrate, a dry film to a top surface of the package molding layer, forming an ink spot radiating laser light to the carrier substrate such that a portion of the dry film is liquified, forming an ink marking pattern by solidifying the ink spot corresponding to the liquefied portion of the dry film, and removing a remaining portion of the dry film from the top surface of the package molding layer, the remaining portion of the dry film having not been liquefied, wherein the ink marking pattern includes at least one of information about storage capacity or information for identifying a producer of a product.

According to another aspect of the inventive concepts, there is provided a method of marking a semiconductor package, the semiconductor package including a semiconductor chip and a package molding layer surrounding the semiconductor chip. The method includes aligning a dry sheet above a top surface of the package molding layer, the dry sheet including a dry film, a first adhesive material attached to a first surface of the dry film and to a carrier substrate, and a second adhesive material attached to a second surface of the dry film opposite to the first surface of the dry film and facing the package molding layer, attaching the second adhesive material to the top surface of the package molding layer, liquefying a portion of the dry film and a portion of the second adhesive material by radiating laser light to the carrier substrate, the portion of the second adhesive material being between the portion of the dry film and the top surface of the package molding layer, forming an ink marking pattern by solidifying an ink spot corresponding to the liquefied portion of the dry film, forming an adhesive layer by solidifying the liquefied portion of the second adhesive material, and removing a remaining portion of the dry film and a remaining portion of the second adhesive material from the top surface of the package molding layer, the remaining portion of each of the dry film and the second adhesive material having not been liquefied, wherein the ink marking pattern includes at least one of information about storage capacity or information for identifying a producer of a product.

According to a further aspect of the inventive concepts, there is provided a method of marking a semiconductor package including a semiconductor chip and a package molding layer surrounding the semiconductor chip. The method includes aligning a dry sheet above a top surface of the package molding layer, the dry sheet including a dry film and an adhesive material attaching the dry film to a carrier substrate, attaching the dry film to the top surface of the package molding layer, forming a hole in the dry film by radiating laser light to the carrier substrate such that a target region of the dry film is liquified, the hole having a tapered shape having a width increasing toward the package molding layer, forming an ink marking pattern including ink spots having a hemispherical shape by solidifying the liquefied portion of the dry film, and removing a remaining portion of the dry film from the top surface of the package molding layer, the remaining portion of the dry film having not been liquefied, wherein a bottom of the hole has a first width and the ink marking pattern has a diameter that is less than the first width, and the ink marking pattern includes at least one of information about storage capacity or information for identifying a producer of a product.

BRIEF DESCRIPTION OF THE DRAWINGS

Embodiments will be more clearly understood from the following detailed description taken in conjunction with the accompanying drawings in which:

FIGS. 4 to 6 are cross-sectional views of semiconductor packages according to some embodiments;

FIGS. 9 to 13 are cross-sectional views of sequential stages in a method of marking a semiconductor package, according to at least one embodiment;

FIG. 16 is a flowchart of a method of marking a semiconductor package, according to some embodiments.

DETAILED DESCRIPTION OF THE EMBODIMENTS

Hereinafter, embodiments are described in detail with reference to the accompanying drawings. However, the inventive concepts should not be construed as being limited to the embodiments and may be embodied in other various forms. The embodiments are provided to fully convey the scope of the inventive concepts to those skilled in the art rather than to allow the inventive concepts to be fully completed.

When the terms "about" or "substantially" are used in this specification in connection with a numerical value and/or geometric terms, it is intended that the associated numerical value includes a manufacturing tolerance (e.g., +10%) around the stated numerical value. Further, regardless of whether numerical values and/or geometric terms are modified as "about" or "substantially," it will be understood that these values should be construed as including a manufacturing or operational tolerance (e.g., +10%) around the stated numerical values and/or geometry.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Figure 1:
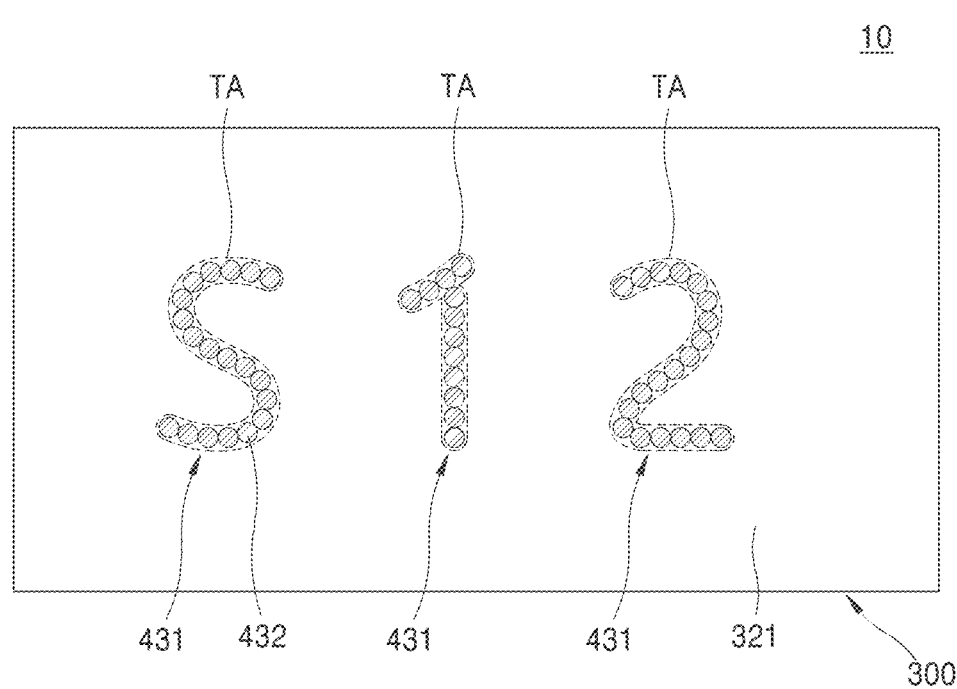
FIG. 1 is a plan view of a semiconductor package according to at least one embodiment.
Figure 2:
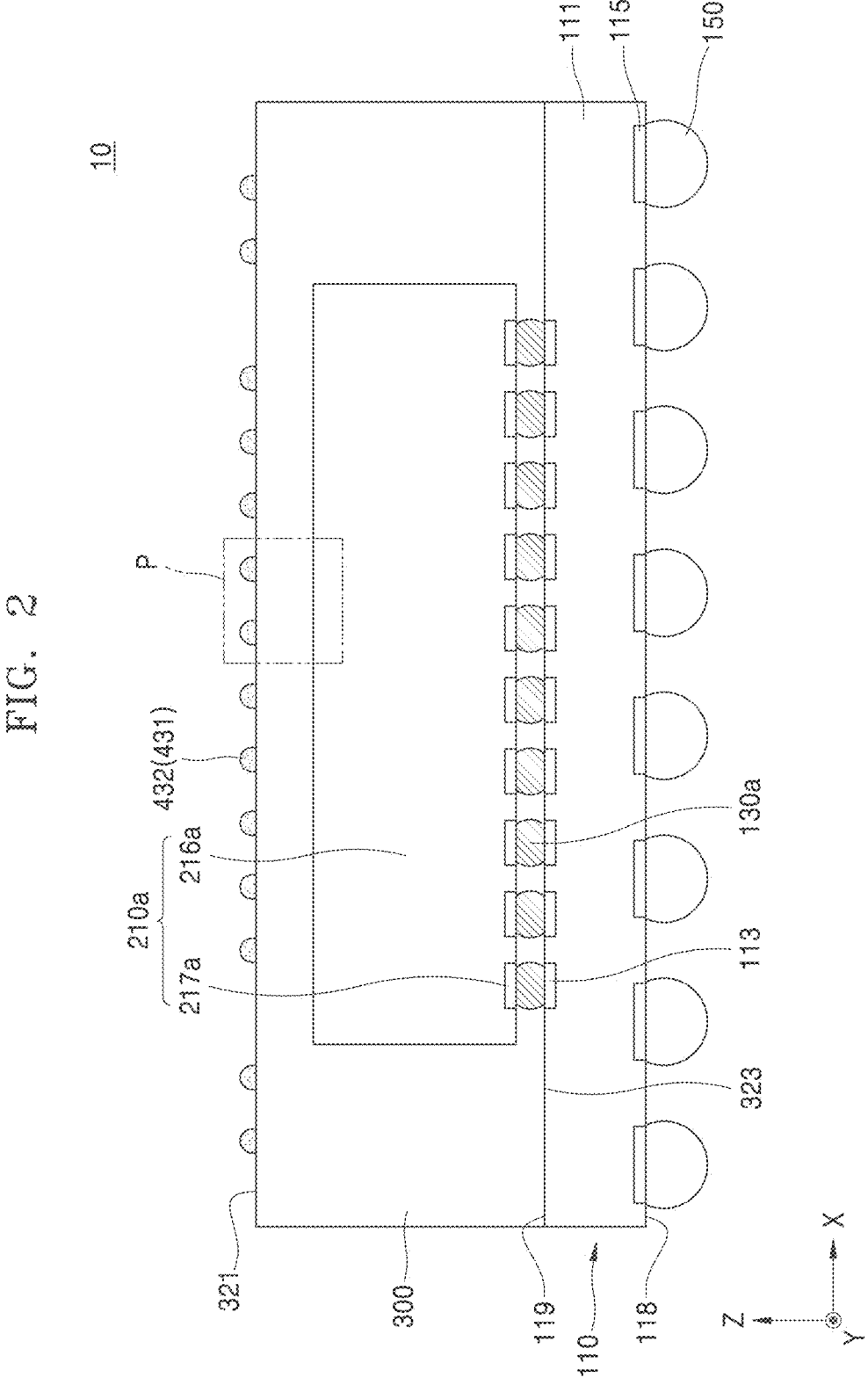
FIG. 2 is a cross-sectional view of a semiconductor package according to at least one embodiment.

FIG. 1 is a plan view of a semiconductor package 10 according to at least one embodiment and FIG. 2 is a cross-sectional view of the semiconductor package 10 according to at least one embodiment.

Referring to FIGS. 1 and 2, the semiconductor package 10 may include a package substrate 110, a first semiconductor chip 210, a package molding layer 300, and an ink marking pattern 431.

The package substrate 110 may have a flat shape (or substantially flat shape) and/or a panel shape. The package substrate 110 may include a top surface 119 and a bottom surface 118, which are opposite to each other and may be flat. Herein, a first horizontal direction (e.g., the X direction) may be defined as a direction that is parallel with the top surface 119 of the package substrate 110 and the vertical direction (e.g., the Z direction) may be defined as a direction that is perpendicular to the top surface 119 of the package substrate 110. A second horizontal direction (e.g., the Y direction) may be defined as a direction that is parallel with the top surface 119 of the package substrate 110 and perpendicular to the first horizontal direction (the X direction) and the vertical direction (the Z direction).

For example, in at least one embodiment, the package substrate 110 may correspond to a printed circuit board (PCB). The package substrate 110 may include a core insulating layer 111, upper connection pads 113, and lower connection pads 115.

The core insulating layer 111 may include an organic insulator, such as at least one of phenol resin, epoxy resin, polyimide, and/or the like. For example, the core insulating layer 111 may include at least one material selected from polyimide, flame retardant 4 (FR4), tetrafunctional epoxy, polyphenylene ether, epoxy/polyphenylene oxide, bismaleimide triazine (BT), thermount, cyanate ester, and/or liquid crystal polymer.

The upper connection pads 113 may be at the top of the top surface 119 and/or the core insulating layer 111. The lower connection pads 115 may be at the bottom surface 118 and/or the bottom of the core insulating layer 111. Internal wiring may be provided in the core insulating layer 111 to electrically connect the upper connection pads 113 to the lower connection pads 115.

The upper connection pads 113 and the lower connection pads 115 may include a conductive material such as a metal (such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), an alloy thereof, and/or the like).

The lower connection pads 115 may be configured to be attached to external connection terminals 150. The external connection terminals 150 may be configured to electrically, thermally, and/or physically connect the package substrate 110 to an external device on which the package substrate 110 is mounted. For example, the external connection terminals 150 may be formed from a solder ball or a solder bump.

The first semiconductor chip 210 may be mounted on the top surface 119 of the package substrate 110. The first semiconductor chip 210 may include a semiconductor substrate 216 and a chip pad 217. The semiconductor substrate 216 may include a top surface and a bottom surface opposite to the top surface. The bottom surface of the semiconductor substrate 216 may correspond to an active surface of the semiconductor substrate 216 and the top surface of the semiconductor substrate 216 may correspond to an inactive surface of the semiconductor substrate 216. The semiconductor substrate 216 may be formed from a semiconductor wafer. For example, the semiconductor substrate 216 may include at least one of an elemental semiconductor (e.g., silicon (Si), germanium (Ge) and/or the like), or a compound semiconductor, (such as silicon carbide (SiC), gallium arsenide (GaAs), indium arsenide (InAs), indium phosphide (InP), and/or the like). The semiconductor substrate 216 may include a conductive region, e.g., an impurity-doped well or structure. A semiconductor device layer including individual devices may be on the active surface of the semiconductor substrate 216. For example, the individual devices may include a transistor. The individual devices may include microelectronic devices, e.g., a metal-oxide-semiconductor field effect transistor (MOSFET), a system large scale integration (LSI), an image sensor such as a complementary metal-oxide-semiconductor (CMOS) image sensor (CIS), a micro-electro-mechanical system (MEMS), an active element, a passive element, and/or the like. The chip pad 217 may be at the bottom of the first semiconductor chip 210 and electrically connected to the individual devices of the semiconductor device layer.

The first semiconductor chip 210 may be mounted on the package substrate 110 in a flip-chip manner. The first semiconductor chip 210 may be electrically and physically connected to the package substrate 110 through chip connection bumps 130. The chip connection bumps 130 may be attached to chip pads 217 of the first semiconductor chip 210 and the upper connection pads 113 of the package substrate 110. The chip connection bumps 130 may include a solder bump.

The first semiconductor chip 210 may be and/or include a memory chip, a logic chip, a system-on-chip (SoC), a power management integrated circuit (PMIC) chip, a radio frequency integrated circuit (RFIC) chip, and/or the like. For example, the memory chip may include a dynamic random access memory (DRAM) chip, a static RAM (SRAM) chip, a magnetic RAM (MRAM) chip, a NAND flash memory chip, a high-bandwidth memory (HBM) chip, and/or the like; and the logic chip may include an application processor (AP), a microprocessor, a central processing unit (CPU), a controller, an application specific integrated circuit (ASIC); and/or the like. For example, a SoC may include at least two circuits of a logic circuit, a memory circuit, a digital IC, an RFIC, an input/output circuit, and/or the like. The first semiconductor chip 210 may have a single-chip structure or a chip stack structure in which a plurality of chips is stacked.

The package molding layer 300 may be on the package substrate 110 and cover at least a portion of the first semiconductor chip 210. For example, the package molding layer 300 may cover at least a portion of the side surfaces of the first semiconductor chip 210 and/or may cover the side and top surfaces of the first semiconductor chip 210. The package molding layer 300 may cover the top surface 119 of the package substrate 110. In at least one embodiment, the package molding layer 300 may include epoxy-group molding resin or polyimide-group molding resin. For example, the package molding layer 300 may include an epoxy molding compound.

The package molding layer 300 may include a bottom surface 323 facing and/or in contact with the top surface 119 of the package substrate 110, a top surface 321 opposite to the bottom surface 323, and side surfaces extending between the top surface 321 and the bottom surface 323. In at least one embodiment, the top surface 321 and the bottom surface 323 of the package molding layer 300 may be flat or substantially flat.

According to a plan view, the shape of the package molding layer 300 may be substantially the same as the shape of the package substrate 110. The horizontal width and planar area of the package molding layer 300 may be substantially the same as those of the package substrate 110. The side surfaces of the package molding layer 300 may be respectively aligned in the vertical direction (the Z direction) with the side surfaces of the package substrate 110. According to a plan view, the package molding layer 300 may have a rectangular shape.

The ink marking pattern 431 may be formed on the top surface of the package molding layer 300. The ink marking pattern 431 may be a collection of a plurality of ink spots 432. In at least one embodiment, the ink marking pattern 431 may include information about storage capacity, information for identifying the producer of a product, and/or the like. The ink marking pattern 431 may correspond to a trademark or logo and provide accurate identification of the semiconductor package 10.

According to at least one embodiment, the color and/or hue of the ink spots 432 of the ink marking pattern 431 may be different from the color and/or hue of the package molding layer 300. When the color of the ink spots 432 is different from the color of the package molding layer 300, the visibility of the ink marking pattern 431 may increase.

According to at least one embodiment, the ink marking pattern 431 may be formed in a target region TA defined on the top surface 321 of the package molding layer 300. The target region TA may be an area, in which the ink spots 432 formed by liquefying a dry film 430 (see FIG. 9) are to be dropped. The ink spots 432 forming the ink marking pattern 431 may be formed by laser processing of a dry film (e.g., the dry film 430 as described in detail below).

Figure 3A:
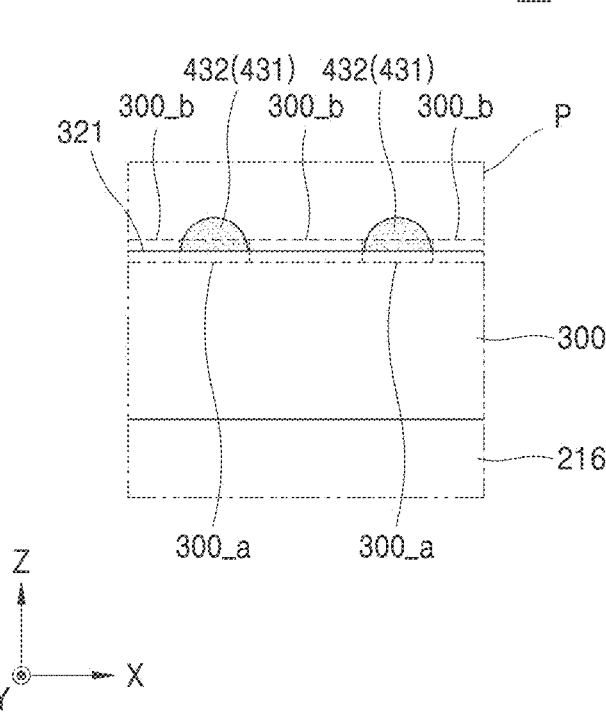
FIG. 3A is an enlarged view of a region P in FIG. 2.

FIG. 3A is an enlarged view of a region P in FIG. 2.

Referring to FIG. 3A, the top surface of the package molding layer 300, on which the ink marking pattern 431 is formed, may be generally (and/or substantially) flat. According to at least one embodiment, to form a mark for identifying the semiconductor package 10, the ink marking pattern 431 is provided instead of etching the package molding layer 300. As shown in FIG. 3A, a first region 300_a of the package molding layer 300 may be defined as including a region, in which the ink marking pattern 431 is formed. A second region 300_b of the package molding layer 300 may be defined as a region, which surrounds the first region 300_a and in which the ink marking pattern 431 is not formed. The first region 300_a and the second region 300_b may be on the same plane as each other on the top surface of the package molding layer 300. Because the package molding layer 300 is not etched when a mark for identifying the semiconductor package 10 is formed, the risk of damage to the first semiconductor chip 210 (and/or the like) may decrease even if the package molding layer 300 is thin.

Figure 3B:
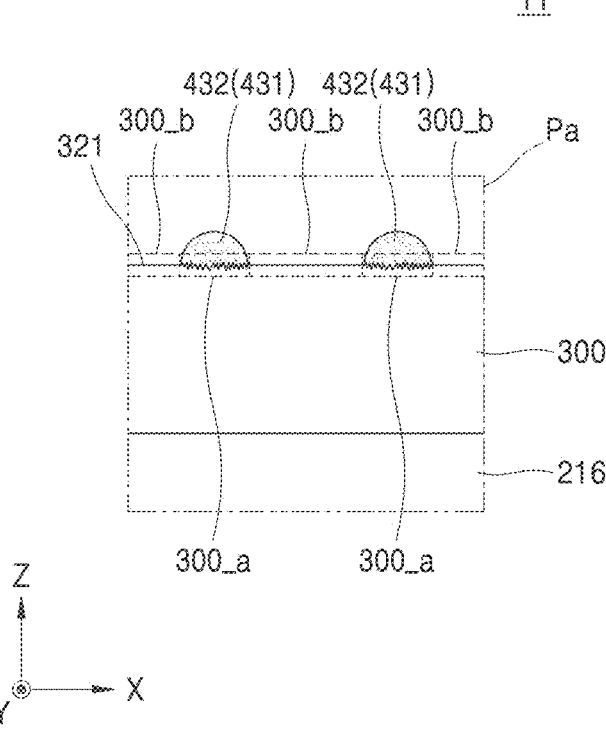
FIGS. 3B and 3C illustrate enlarged views of semiconductor packages according to embodiments, corresponding to the enlarged view of FIG. 3A.
Figure 3C:
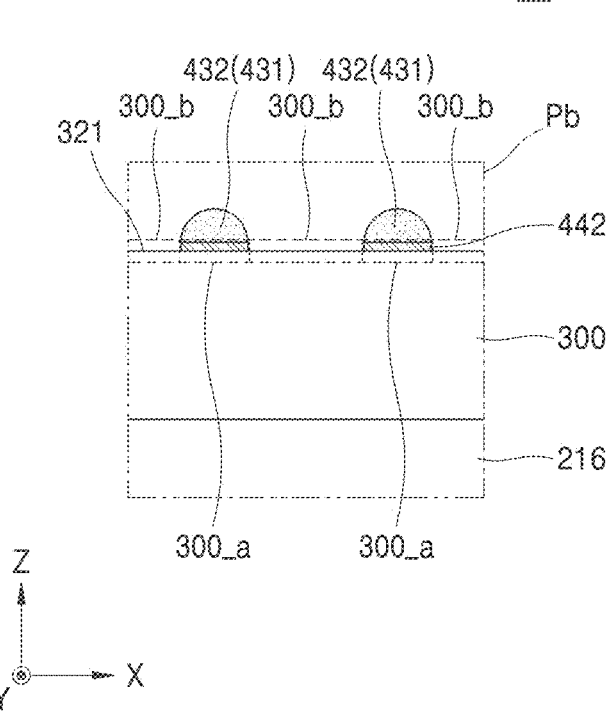

FIGS. 3B and 3C illustrate enlarged views of semiconductor packages 11 and 12 according to some embodiments, corresponding to the enlarged view of FIG. 3A, with the region Pa in FIG. 3B and the region Pb in FIG. 3C each corresponding to the region P in FIG. 3A. The semiconductor packages 11 and 12 respectively illustrated in FIGS. 3B and 3C are nearly the same as or similar to the semiconductor package 10 of FIG. 3A, except for the shape or configuration of the first region 300_a.

Referring to FIG. 3B, the semiconductor package 11 may include the package molding layer 300, which surrounds the semiconductor chip 210, and the ink marking pattern 431 on the top surface 321 of the package molding layer 300. The ink marking pattern 431 may include a plurality of ink spots 432. In the semiconductor package 11 of FIG. 3B unlike the semiconductor package 10 of FIG. 3A, the surface roughness of the top surface 321 of the package molding layer 300 in the first region 300_a may be different from the surface roughness of the top surface 321 of the package molding layer 300 in the second region 300_b. For example, the surface roughness of the first region 300_a may be higher than the surface roughness of the second region 300_b. As will be described in detail below, laser light may be radiated to the dry film 430 to form an ink spot 432 in the first region 300_a. At this time, part of the laser light radiated to the dry film 430 may pass through the dry film 430 and reach the package molding layer 300. The laser light that has passed through the dry film 430 may etch a portion of the package molding layer 300 so that the surface roughness of the first region 300_a may be higher than the surface roughness of the second region 300_b.

Referring to FIG. 3C, the semiconductor package 12 may further include an adhesive layer 442 between the package molding layer 300 and the ink spot 432. The adhesive layer 442 may prevent (and/or reduce the potential for) the ink spot 432 from falling off from the package molding layer 300. When viewed in the plan view, the adhesive layer 442 may completely cover the ink spot 432. In other words, when viewed from the vertical direction (the Z direction), the area of the top surface of the adhesive layer 442 may be substantially the same as the area of the bottom surface of the ink spot 432. However, embodiments are not limited thereto. The area of the top surface of the adhesive layer 442 may be larger than the area of the bottom surface of the ink spot 432 when viewed in the plan view. At this time, when viewed from the vertical direction (the Z direction), the adhesive layer 442 may protrude outward from the outer edge of the ink spot 432. However, in order for the adhesive layer 442 to prevent the ink spot 432 from falling off from the package molding layer 300, it is desirable that at least the area of the top surface of the adhesive layer 442 is the same as and completely overlaps the area of the bottom surface of the ink spot 432.

According to at least one embodiment, the adhesive layer 442 may include an adhesive film such as a direct adhesive film (DAF). The DAF may include components of generally used gluing agents, adhesives, and/or the like. For example, the DAF may include, for example, at least one selected from the group consisting of epoxy, polyamide, acryl, and polyimide. For example, the DAF may include at least one of acryl, vinyl acetate, an ethylene-vinyl acetate copolymer, an ethylene-acrylic acid ester copolymer, polyamide poly-ethylene polysulfone, epoxy, polyimide, polyamic acid, a silicon phenol rubber polymer, flurororubber polymer, fluo-roresin, and/or the like.

Figure 4:
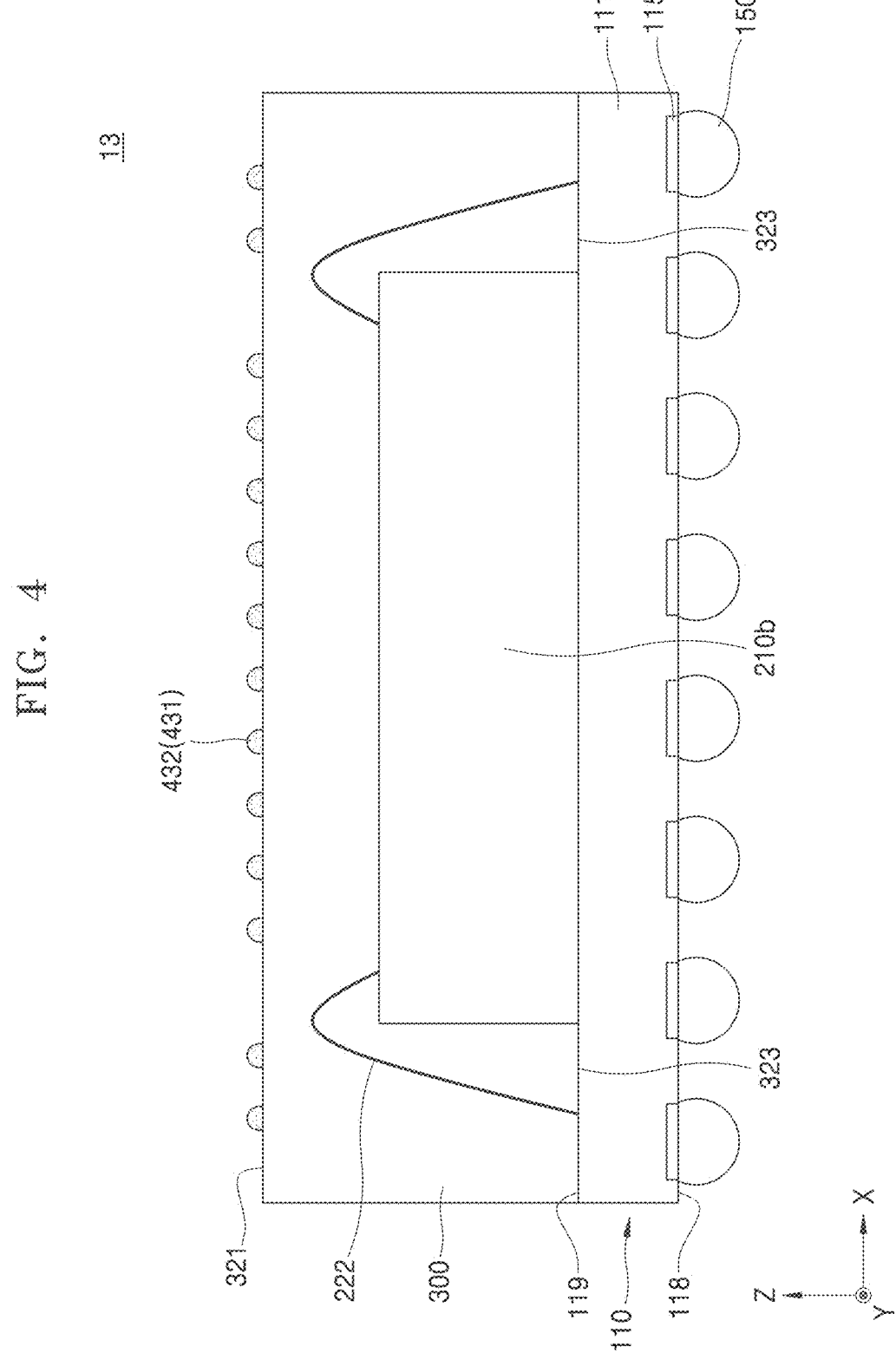
Figure 5:
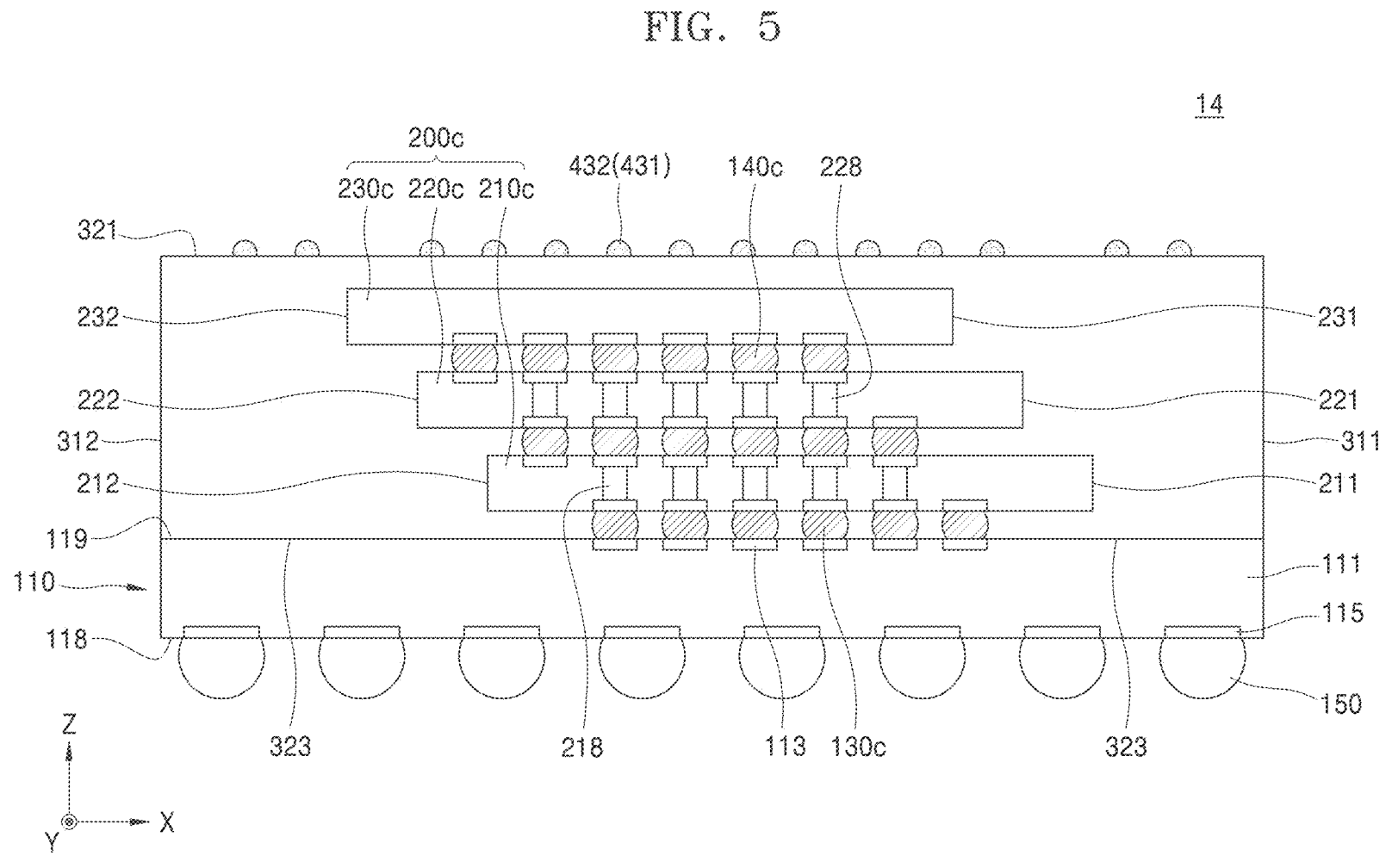
Figure 6:
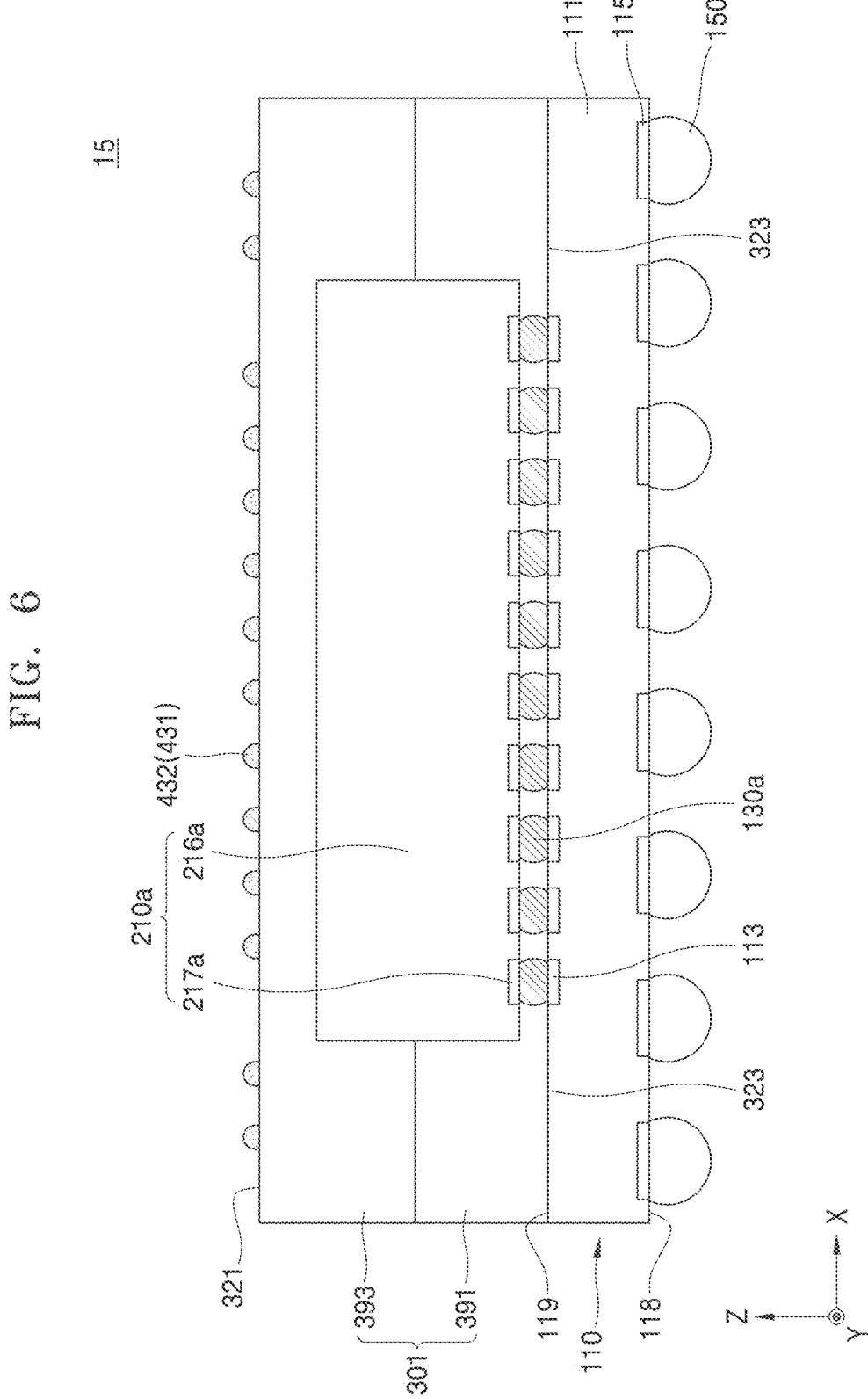

FIGS. 4 to 6 are cross-sectional views of semiconductor packages according to some embodiments. A semiconductor package 13 of FIG. 4 is nearly the same as or similar to the semiconductor package 10 of FIG. 2, except for the bonding method by which a semiconductor chip 210b is mounted on the package substrate 110. Therefore, redundant descriptions of the elements described above with reference to FIG. 2 are brief or omitted.

Referring to FIG. 4, the semiconductor chip 210b of the semiconductor package 13 may be mounted on the package substrate 110 by wire bonding. The wire bonding is an example of a bonding method that enables the semiconduc-tor chip 210b to be electrically connected to the package substrate 110 or other elements using at least one metal wire.

The semiconductor chip 210b may be attached to the package substrate 110. Thereafter, the semiconductor chip 210b may be electrically connected to the package substrate 110 by using a conductive wire 222. An upper chip pad (now shown) may be on the top surface of the semiconductor chip 210b. One end of the conductive wire 222 may be connected to the upper chip pad and the other end of the conductive wire 222 may be connected to the package substrate 110.

The conductive wire 222 may be completely buried by the package molding layer 300. According to at least one embodiment, the conductive wire 222 may be bent in the vertical direction (the Z direction) with a curve. The top surface 321 of the package molding layer 300 may be higher than the top of the conductive wire 222. In addition, the package molding layer 300 is intentionally not etched by an engraving or embossing method in order to form an identi-fication marking in the package molding layer 300, and therefore, the risk of the conductive wire 222 being damaged decreases.

A semiconductor package 14 of FIG. 5 is nearly the same as or similar to the semiconductor package 10 of FIG. 2, except that a chip structure 200c is mounted on the package substrate 110. Therefore, redundant descriptions of the ele-ments described above with reference to FIG. 2 are brief or omitted.

Referring to FIG. 5, the semiconductor package 14 may include a chip structure 200c including a plurality of semi-conductor chips (e.g., first to third semiconductor chips 210c, 220c, and 230c) stacked in the vertical direction (the Z direction). Although it is illustrated in FIG. 5 that the chip structure 200c includes three semiconductor chips, embodi-ments are not limited thereto. The chip structure 200c may include two or at least four semiconductor chips.

The first to third semiconductor chips 210c, 220c, and 230c may have a three-dimensional (3D) stack structure. The first semiconductor chip 210c may be mounted on the package substrate 110 via a first chip connection bump 130c. The second semiconductor chip 220c may be mounted on the first semiconductor chip 210c via an inter-chip connec-tion bump 140c. The third semiconductor chip 230c may be mounted on the second semiconductor chip 220c via an inter-chip connection bump 140c. The first semiconductor chip 210c may include a first through electrode 218 passing through a semiconductor substrate of the first semiconductor chip 210c. The second semiconductor chip 220c may include a second through electrode 228 passing through a semiconductor substrate of the second semiconductor chip 220c. The second semiconductor chip 220c may be electri-cally connected to the first through electrode 218 of the first semiconductor chip 210c. The third semiconductor chip 230c may be electrically connected to the second through electrode 228 of the second semiconductor chip 220c.

In some embodiments, the top surface of semiconductor chip at the top (e.g., the third semiconductor chip 230c) among the first to third semiconductor chips 210c, 220c, and 230c may be covered with the package molding layer 300. In some embodiments, the top surface of the third semicon-ductor chip 230c may be exposed to the outside of the semiconductor package 14 and coplanar with the top surface 321 of the package molding layer 300. In embodiments, a heat dissipation unit may be attached to the top surface of the third semiconductor chip 230c.

The first to third semiconductor chips 210c, 220c, and 230c may have substantially the same dimensions as one another. For example, the first to third semiconductor chips 210c, 220c, and 230c may have the same length in the first horizontal direction (the X direction), the same length in the second horizontal direction (the Y direction), and the same length in the vertical direction (the Z direction). According to a plan view, each of the first to third semiconductor chips 210c, 220c, and 230c may have a rectangular shape. Respec-tive first side surfaces 211, 221, and 231 of the first to third semiconductor chips 210, 220, and 230 may face a first side surface 311 of the package molding layer 300. Respective second side surfaces 212, 222, and 232 of the first to third semiconductor chips 210c, 220c, and 230c may face a second side surface 312 of the package molding layer 300.

In some embodiments, the first to third semiconductor chips 210c, 220c, and 230c may be stacked sequentially offset in the first horizontal direction (the X direction). The first horizontal direction (the X direction) may be perpen-dicular to the first side surface 311 of the package molding layer 300 and parallel with the top surface 119 of the package substrate 110. The lower one of two semiconductor chips adjacent in the vertical direction (the Z direction) among the first to third semiconductor chips 210c, 220c, and 230c may protrude in the first horizontal direction (the X direction) from the first side surface of the upper one of the two semiconductor chips. For example, the distance between the first side surface 311 of the package molding layer 300 and the upper one of two semiconductor chips adjacent in the vertical direction (the Z direction) among the first to third semiconductor chips 210c, 220c, and 230c may be greater than the distance between the first side surface 311 of the package molding layer 300 and the lower one of the two semiconductor chips. For example, a portion of the first semiconductor chip 210c may protrude in the first horizontal direction (the X direction) from the first side surface 221 of the second semiconductor chip 220c and a portion of the second semiconductor chip 220c may protrude in the first horizontal direction (the X direction) from the first side surface 231 of the third semiconductor chip 230c. For example, the distance between the first side surface 221 of the second semiconductor chip 220c and the first side surface 311 of the package molding layer 300 in the first horizontal direction (the X direction) may be greater than the distance between the first side surface 211 of the first semiconductor chip 210c and the first side surface 311 of the package molding layer 300 in the first horizontal direction (the X direction), and the distance between the first side surface 231 of the third semiconductor chip 230 and the first side surface 311 of the package molding layer 300 in the first horizontal direction (the X direction) may be greater than the distance between the first side surface 221 of the second semiconductor chip 220c and the first side surface 311 of the package molding layer 300 in the first horizontal direction (the X direction).

The chip structure 200c may be completely buried by the package molding layer 300. According to at least one embodiment, the top surface 321 of the package molding layer 300 may be higher than the top surface of the third semiconductor chip 230c at the top among the first to third semiconductor chips 210c, 220c, and 230c. In addition, the package molding layer 300 is not intentionally etched by an engraving or embossing method in order to form an identification marking in the package molding layer 300, and therefore, the risk of the third semiconductor chip 230c being damaged may decrease. Accordingly, even when the package molding layer 300 is formed thin, the chip structure 200c may be reliably protected from external impact.

A semiconductor package 15 of FIG. 6 is nearly the same as or similar to the semiconductor package 10 of FIG. 2, except that a package molding layer 301 includes two layers. Therefore, redundant descriptions of the elements described above with reference to FIG. 2 are brief or omitted.

Referring to FIG. 6, the package molding layer 301 of the semiconductor package 15 may include a first molding layer 391 and a second molding layer 393. The second molding layer 393 may be on the first molding layer 391. The ink marking pattern 431 may be on the top surface of the second molding layer 393. The material of the second molding layer 393 may be different from the material of the first molding layer 391. In at least one embodiment, the second molding layer 393 may include a photosensitive material, a photosensitive additive, a thermosensitive material, and/or a thermosensitive additive. For example, the photosensitive material of the second molding layer 393 may react to laser light so that the color of the second molding layer 393 may be changed by the laser light. For example, the thermosensitive material of the second molding layer 393 may react to laser light such that the color of the second molding layer 393 may be changed (and/or developed). When laser light is radiated to the dry film 430 to form the ink marking pattern 431, part of the laser light may reach the second molding layer 393 through a carrier substrate 410 (see FIG. 9), an adhesive material 420 (see FIG. 9), and the dry film 430. A photosensitive material and/or thermosensitive material of the second molding layer 393 may react to the part of the laser light so that the color of the second molding layer 393 may be changed. Because the ink marking pattern 431 has a different color than the other region of the package molding layer 301 that is not irradiated with the laser light, the visibility of the ink marking pattern 431 may increase.

Figure 7:
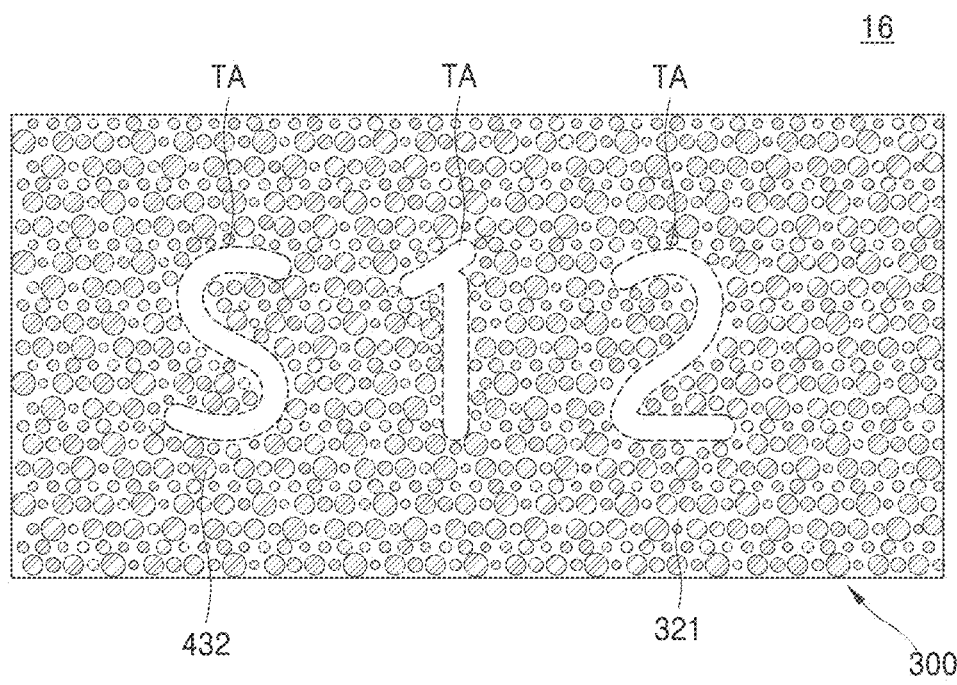
FIG. 7 is a plan view of a semiconductor package according to at least one embodiment.

FIG. 7 is a plan view of a semiconductor package 16 according to at least one embodiment.

Referring to FIG. 7, an identification marking of the semiconductor package 16 may be formed by an engraving method. When viewed in the plan view, the top surface of the package molding layer 300 may include a target region TA. Unlike the semiconductor package 10 of FIG. 1, ink spots 432 formed by liquefying the dry film 430 are not formed in the target region TA of the semiconductor package 16. The ink spots 432 may be formed in the remaining region excluding the target region TA on the top surface 321 of the package molding layer 300. The target region TA may be smaller than the remaining region on the top surface 321 of the package molding layer 300. The target region TA may include information about the storage capacity of the semiconductor package 16, information for identifying the producer of a product, or information about the product name of the semiconductor package 16. Examples of information provided by the target region TA are not limited to the information described above.

Figure 8:
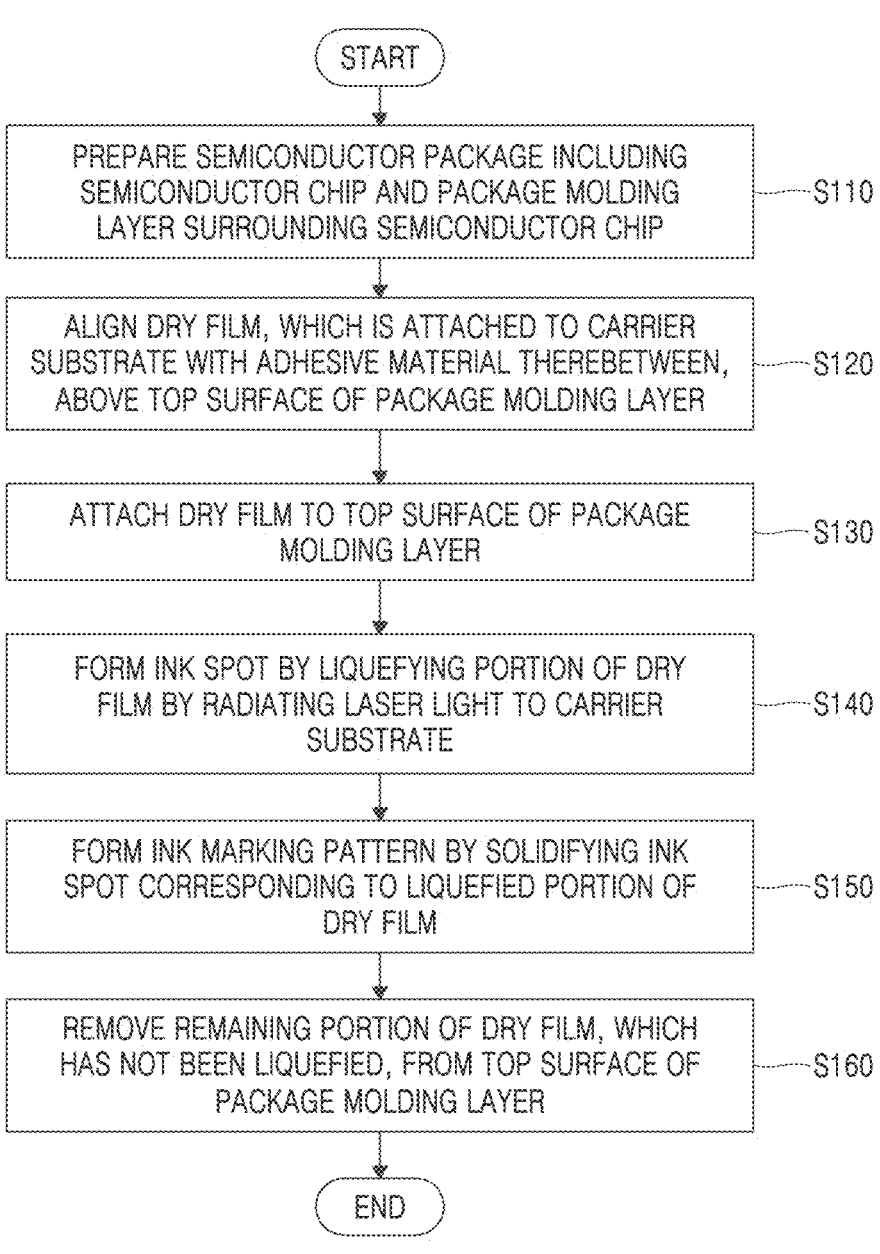
FIG. 8 is a flowchart of a method of marking a semiconductor package, according to at least one embodiment.

FIG. 8 is a flowchart of a method of marking a semiconductor package, according to at least one embodiment. FIGS. 9 to 13 are cross-sectional views of sequential stages in the method of FIG. 8, according to at least one embodiment. According to at least one embodiment, a method of marking a semiconductor package is described below with reference to the accompanying drawings.

Figure 9:
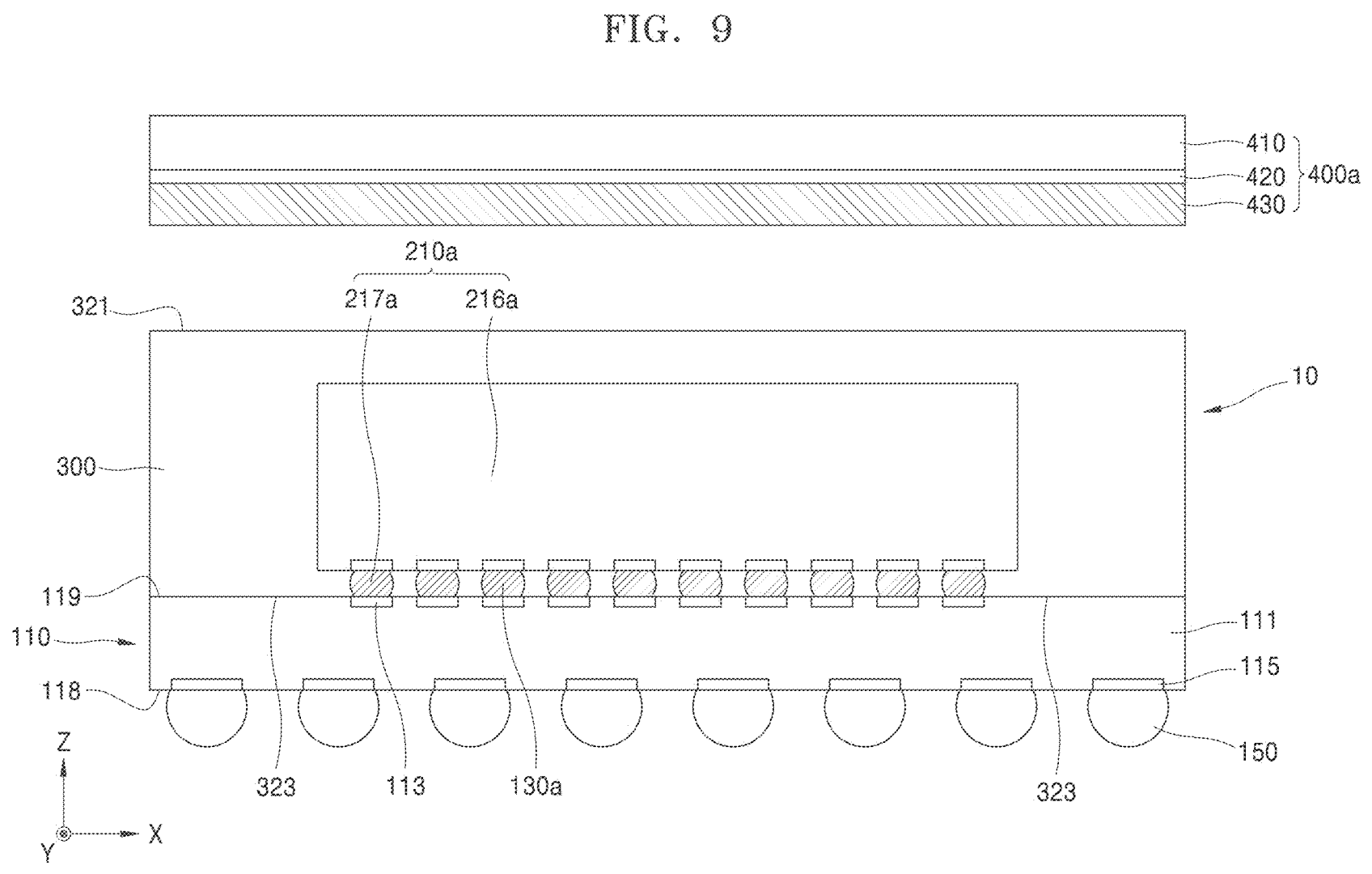

Referring to FIGS. 8 and 9, the method of marking a semiconductor package may include preparing the semiconductor package 10 including a semiconductor chip 210a and the package molding layer 300 surrounding the semiconductor chip 210a in operation S110.

In at least one embodiment, the semiconductor chip 210a may be mounted in a flip-chip manner on the package substrate 110 via the first chip connection bump 130. Therefore, the semiconductor package 10 in FIG. 9 may be substantially the same as the semiconductor package 10 of FIG. 2, except that the ink marking pattern 431 has not been formed on the top surface 321 of the package molding layer 300. The semiconductor package 10 in FIG. 9 includes one semiconductor chip 210a, but embodiments are not limited thereto. The semiconductor package 10 may include at least two semiconductor chips, which are apart from each other in a horizontal direction, or may include an interposer substrate. The top surface 321 of the package molding layer 300 may not be inclined in a diagonal direction and may have a flat shape that is parallel with the first horizontal direction (the X direction) and the second horizontal direction (the Y direction).

Figure 10:
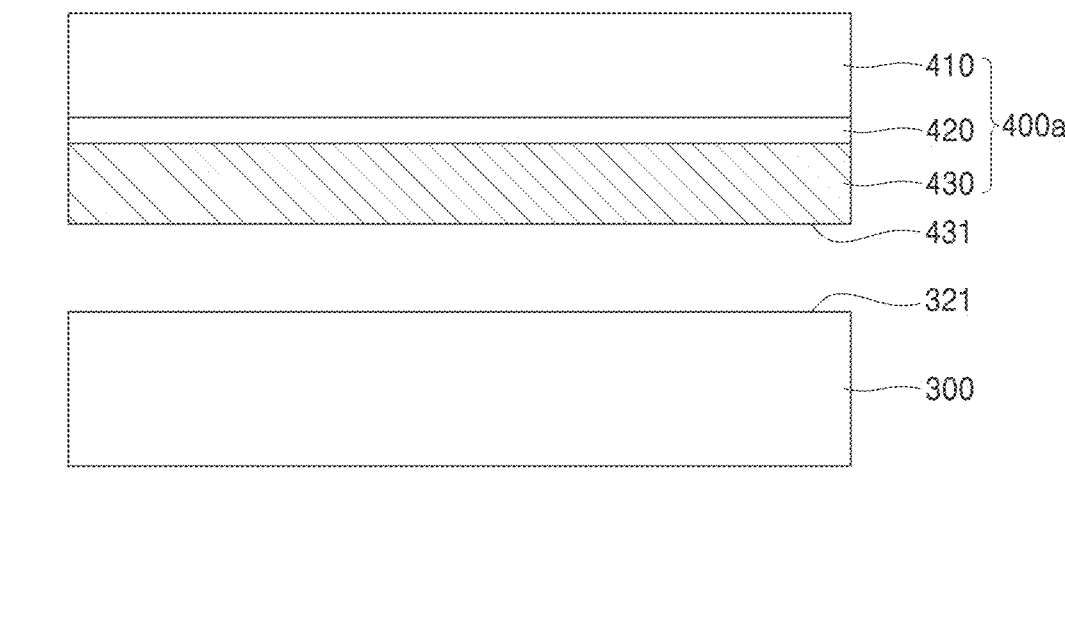

Referring to FIGS. 8 and 10, the dry film 430, which is attached to a carrier substrate 410 (e.g., with the adhesive material 420 between the dry film 430 and the carrier substrate 410) may be aligned above the top surface 321 of the package molding layer 300 in operation S120.

According to at least one embodiment, a dry sheet 400a may be aligned above the top surface 321 of the package molding layer 300. At this time, the dry sheet 400a may include the carrier substrate 410, the adhesive material 420, and the dry film 430, which are sequentially stacked in the vertical direction (the Z direction) toward the top surface 321 of the package molding layer 300. The adhesive material 420 may be attached to the bottom surface of the carrier substrate 410, and the dry film 430 may be attached to the bottom surface of the adhesive material 420. The adhesive material 420 may be relatively thin compared to the carrier substrate 410 and/or the dry film 430. The adhesive material 420 may be conformally attached to the flat bottom surface of the carrier substrate 410. The dry film 430 may be conformally attached to the flat bottom surface of the adhesive material 420. The length in a lateral direction of each of the carrier substrate 410, the adhesive material 420, and the dry film 430 may be the same as the length of the package molding layer 300 in the lateral direction. In other words, when viewed in the vertical direction (the Z direction), the area of the top surface 321 of the package molding layer 300 may be the same as the area of the top surface of each of the carrier substrate 410, the adhesive material 420, and the dry film 430.

According to at least one embodiment, the carrier substrate 410 may be selected to be transparent to light. For example, the carrier substrate 410 may be a glass substrate.

According to at least one embodiment, the adhesive material 420 may include components of generally used gluing agents or adhesives. For example, the adhesive material 420 may include at least one selected from the group consisting of epoxy, polyamide, acryl, and polyimide. For example, the adhesive material 420 may include at least one selected from the group consisting of acryl, vinyl acetate, an ethylene-vinyl acetate copolymer, an ethylene-acrylic acid ester copolymer, polyamide polyethylene polysulfone, epoxy, polyimide, polyamic acid, a silicon phenol rubber polymer, flurororubber polymer, and fluororesin.

According to at least one embodiment, the dry film 430 may include, but not limited to, at least one material selected from the group consisting of phenol resin, epoxy resin, and polyimide. For example, the dry film 430 may include at least one selected from FR4, tetrafunctional epoxy, polyphenylene ether, epoxy/polyphenylene oxide, BT, thermount, cyanate ester, polyimide, and liquid crystal polymer.

Figure 11A:
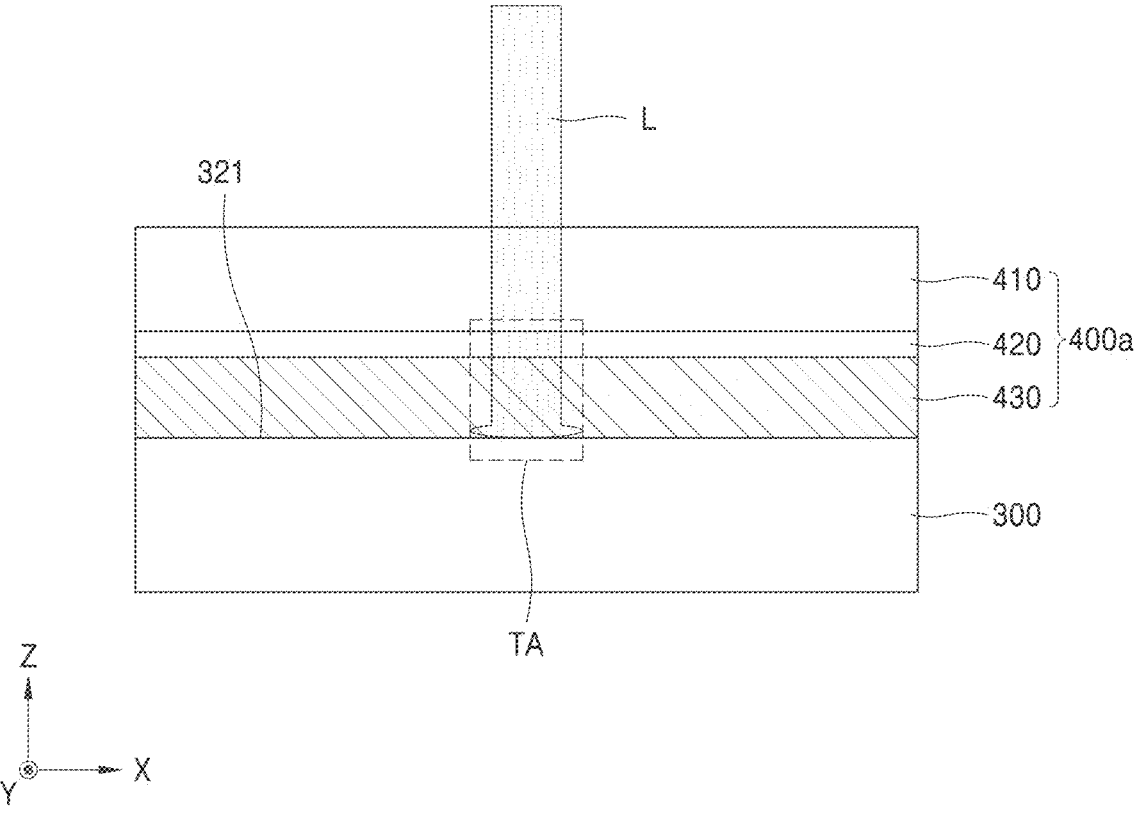

Referring to FIGS. 8 and 11A, the dry film 430 may be attached to the top surface 321 of the package molding layer 300 in operation S130.

According to at least one embodiment, the dry film 430 may be attached to the package molding layer 300 along the top surface 321 of the package molding layer 300. The bottom surface of the dry film 430 may be coplanar with the top surface 321 of the package molding layer 300. When the package molding layer 300 includes the package molding layer 301 (see FIG. 6) having a vertical stack of two layers, the dry film 430 may be attached to the top surface of the second molding layer 393 (see FIG. 6).

Figure 12:
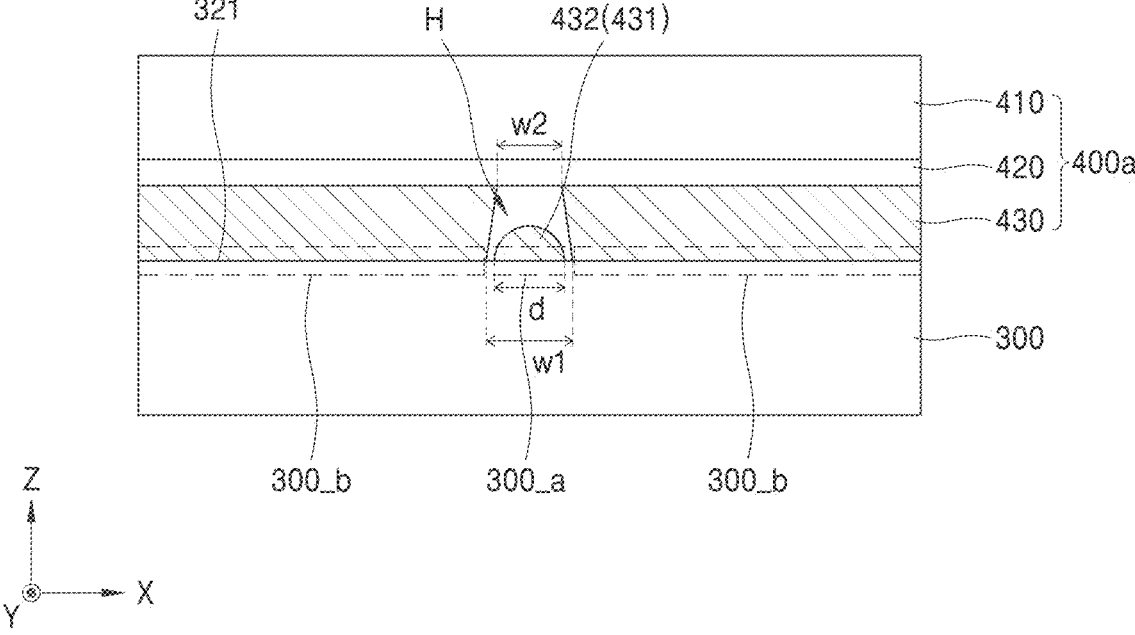

Referring to FIGS. 8, 11A, and 12, an ink spot may be formed by liquefying a portion of the dry film 430 by radiating laser light to the carrier substrate 410 in operation S140.

According to at least one embodiment, after the dry film 430 is attached to the top surface 321 of the package molding layer 300 laser light L may be radiated at low energy of about 1 W to about 5 W. The laser light L may pass through the carrier substrate 410 and the adhesive material 420 and may be radiated to the dry film 430 on the package molding layer 300. The package molding layer 300 may include a target region TA. The laser light L may be radiated to the target region TA of the package molding layer 300. The target region TA may be an area that is targeted to form an ink spot 432 therein by liquefying the dry film 430. Accordingly, a portion of the dry film 430, which overlaps the target region TA, may be irradiated with the laser light L. The area of the target region TA on the top surface of the package molding layer 300 may be smaller than the area of the remaining region excluding the target region TA on the top surface of the package molding layer 300.

According to at least one embodiment, the melting point of the adhesive material 420 may be higher than the melting point of the dry film 430, and accordingly, the adhesive material 420 may not be liquefied by the laser light L, and only the dry film 430 may be liquefied by the laser light L.

According to at least one embodiment, in the process of forming the ink spot 432, a hole may be formed in a portion of the dry film 430, wherein the hole may have a tapered shape having a width increasing toward the package molding layer 300. The laser light L may spread out in the horizontal direction (e.g., the X direction and the Y direction) as the laser light L travels in a radiation direction (e.g., the Z direction), thereby forming a hole H having a tapered shape in the dry film 430. The bottom of the hole H may have a first width W1 and the top of the hole H may have a second width W2 that is less than the first width W1.

Figure 11B:
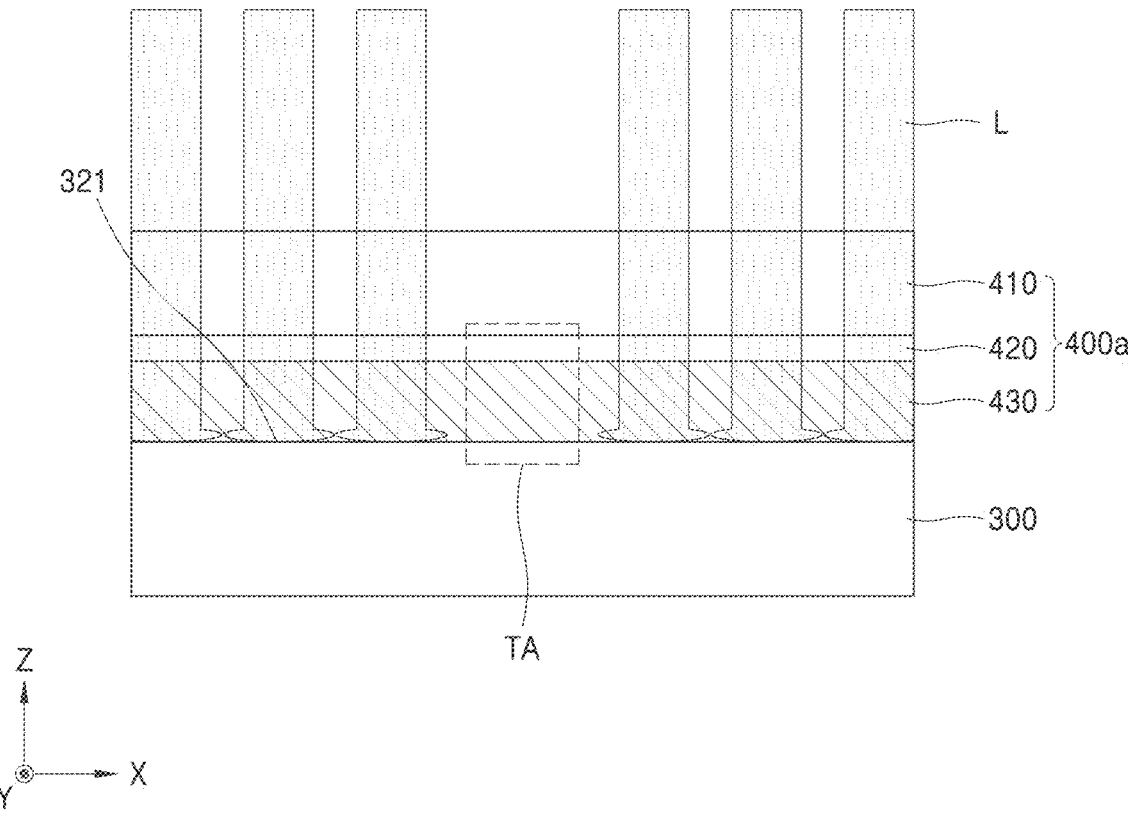

FIG. 11B illustrates a method of marking a semiconductor package, according to some embodiments. FIG. 11B corresponds to FIG. 11A and illustrates a process of radiating the laser light L to the carrier substrate 410. The method is described with reference to FIG. 11B below.

According to at least one embodiment, the top surface of the package molding layer 300 may include the target region TA when viewed in the plan view. At this time, the area of the target region TA may be less than the remaining region of the top surface of the target region TA excluding the target region TA. The region of the dry film 430 except for a region overlapping the target region TA may be irradiated with the laser light L. At this time, ink spots 432 (see FIG. 7) formed by liquefying the dry film 430 may not be in the target region TA. The ink spots 432 may be formed in the remaining region of the top surface 321 of the package molding layer 300 excluding the target region TA. The ink marking pattern 431 (see FIG. 7) constituted of the ink spots 432 may have an engraved shape.

Referring to FIGS. 8 and 12, the ink marking pattern 431 may be formed by solidifying the ink spot 432, which is the liquefied portion of the dry film 430, in operation S150.

The ink spot 432 may shrink during the solidification thereof. At this time, the ink spot 432 forming the ink marking pattern 431 may have a hemispherical shape due to the shrinkage. A diameter "d" of the ink spot 432 having the hemispherical shape may be less than the first width W1 of the hole H. Accordingly, the ink spot 432 having the hemispherical shape may be apart from the dry film 430, which has not been liquefied, in the first horizontal direction (the X direction) and the second horizontal direction (the Y direction). The ink spot 432 having the hemispherical shape may also be apart from the dry film 430, which has not been liquefied, in the vertical direction (the Z direction). At this time, the bottom surface of the dry film 430, which has not been liquefied, has been attached to the top surface 321 of the package molding layer 300. In other words, the dry film 430 that has not been liquefied may be apart from the ink spot 432 that has been formed by liquefying the dry film 430.

According to at least one embodiment, the package molding layer 300 may include a first region 300_a, which includes a portion in which the ink spot 432 forming the ink marking pattern 431 is formed, and a second region 300_b, which surrounds the first region 300_a and in which the ink marking pattern 431 is not formed. As shown in FIG. 12, the surface roughness of the first region 300_a of the package molding layer 300 may be the same as the surface roughness of the second region 300_b of the package molding layer 300. When the laser light L radiated to the dry film 430 does not have energy strong enough to penetrate the dry film 430 and etch the package molding layer 300, the package molding layer 300 may hardly be etched. In this case, the surface roughness of the first region 300_a of the package molding layer 300 may be the same as the surface roughness of the second region 300_b of the package molding layer 300 because the first region 300_a of the package molding layer 300 is hardly etched. At this time, the top surface of the first region 300_a of the package molding layer 300 may be coplanar with the top surface of the second region 300_b of the package molding layer 300.

However, according to some embodiments of a method of marking a semiconductor package, the surface roughness of the first region 300_a of the package molding layer 300 may be higher than the surface roughness of the second region 300_b of the package molding layer 300, as shown in FIG. 3B. When the laser light L radiated to the dry film 430 has energy strong enough to penetrate the dry film 430 and etch the package molding layer 300, the package molding layer 300 may be partially etched. In this case, the surface roughness of the first region 300_a of the package molding layer 300 may be higher than the surface roughness of the second region 300_b of the package molding layer 300 because the first region 300_a of the package molding layer 300 is etched.

Figure 13:
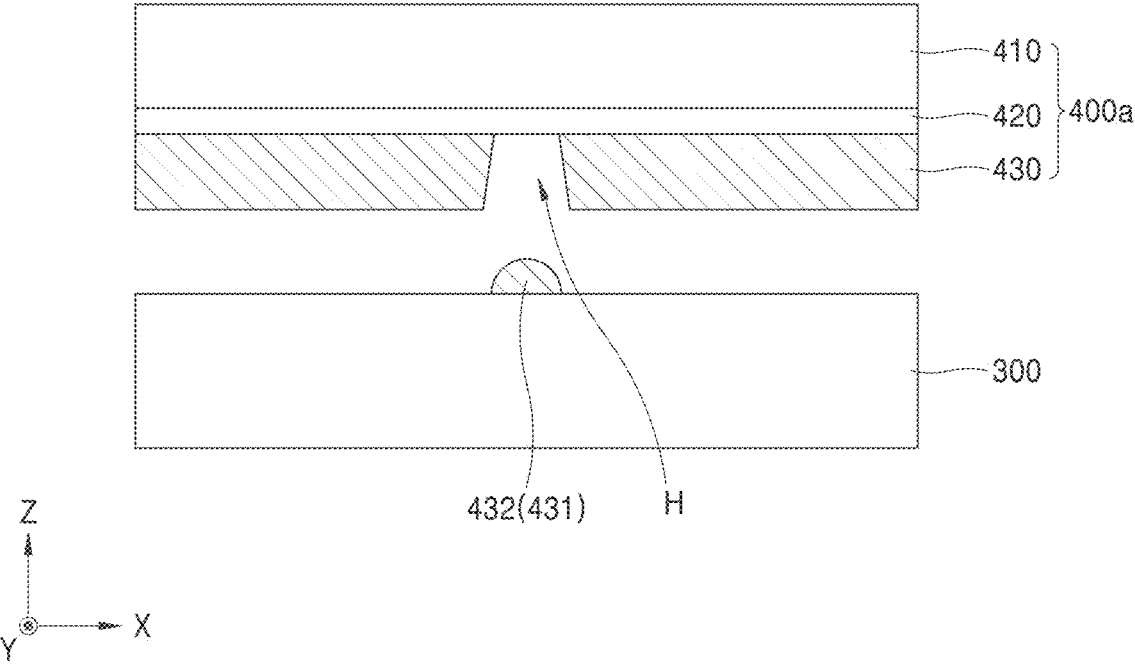

Referring to FIGS. 8 and 13, the remaining portion of the dry film 430 that has not been liquefied may be removed from the top surface of the package molding layer 300 in operation S160.

According to at least one embodiment, only the ink spot 432 that has been solidified may remain on the top surface of the package molding layer 300, and the remaining portion of the dry film 430 that has not been liquefied may be removed from the top surface of the package molding layer 300. At this time, the dry film 430 has the hole H.

Figure 14:
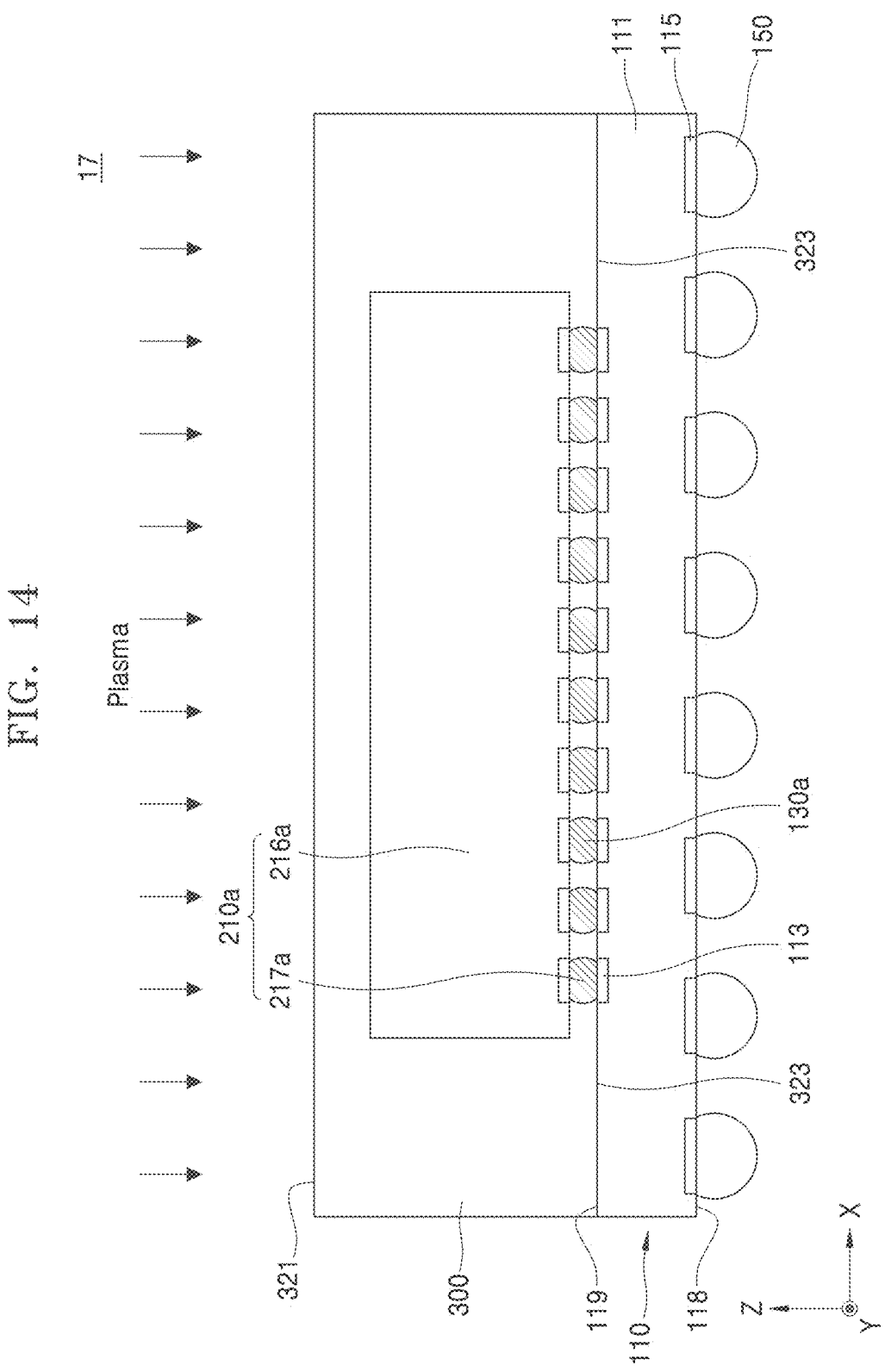
FIGS. 14 and 15 are cross-sectional views illustrating a method of marking a semiconductor package, according to some embodiments.
Figure 15:
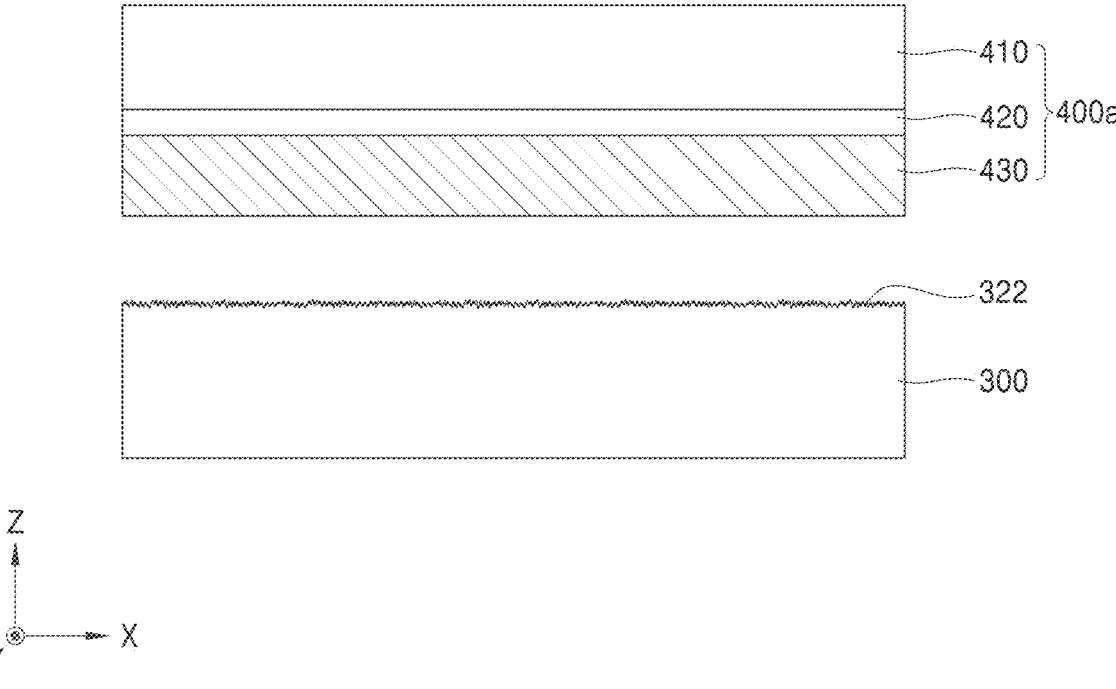

FIGS. 14 and 15 are cross-sectional views illustrating a method of marking a semiconductor package, according to some embodiments. Descriptions below are made with reference to FIGS. 14 and 15. Redundant descriptions of the elements illustrated in FIGS. 2 and 10 are omitted below.

The method of marking a semiconductor package may further include increasing the surface roughness of the package molding layer 300 by performing a plasma treatment on the top surface 321 of the package molding layer 300 before attaching the dry film 430 to the top surface 321 of the package molding layer 300. Before the dry film 430 is aligned above the top surface 321 of the package molding layer 300, a plasma treatment may be performed on the top surface 321 of the package molding layer 300, as shown in FIG. 14. At this time, the plasma treatment may be performed on the top surface 321 of the package molding layer 300 in all directions.

When the plasma treatment is performed on the top surface 321 of the package molding layer 300, a rugged portion may be formed on the top surface 321 of the package molding layer 300. Here, the rugged portion may refer to a concave-convex structure in which concavities and convexities are regularly and/or irregularly repeated. The plasma treatment may include an Ar plasma treatment or an $H_2$ plasma treatment. The plasma treatment may be repeatedly performed. When a plurality of plasma treatments are performed, the plasma treatments may include additional plasma treatments (e.g., an $O_2$ plasma treatment), but it is desirable that the last plasma treatment is an Ar plasma treatment or an $H_2$ plasma treatment. The rugged portion may have a root mean square (RMS) roughness of at least 5 Å. When the rugged portion has an RMS roughness of at least 5 Å, the area of the top surface 321 of the package molding layer 300 barely increases, and accordingly, the adhesion of the dry film 430 hardly increases.

The top surface 321 of the package molding layer 300 in FIG. 15 may have a relatively high roughness compared to the top surface 321 of the package molding layer 300 in FIG. 10. The higher the roughness of the top surface 321 of the package molding layer 300, the better the ink spot 432 formed by liquefying the dry film 430 may adhere to the top surface 321 of the package molding layer 300. The higher the roughness of the top surface 321 of the package molding layer 300, the wider the contact area between the ink spot 432 and the package molding layer 300 may be. When the contact area between the ink spot 432 and the package molding layer 300 increases, the adhesive strength between the ink spot 432 and the package molding layer 300 may also increase.

FIG. 16 is a flowchart of a method of marking a semiconductor package, according to some embodiments, and FIGS. 17 to 20 are cross-sectional views of sequential stages in the method. A method of marking a semiconductor package, according to some embodiments, is described below with reference to the accompanying drawings. Redundant descriptions of the elements described above with reference to FIGS. 9 to 13 are brief or omitted below.

Figure 17:
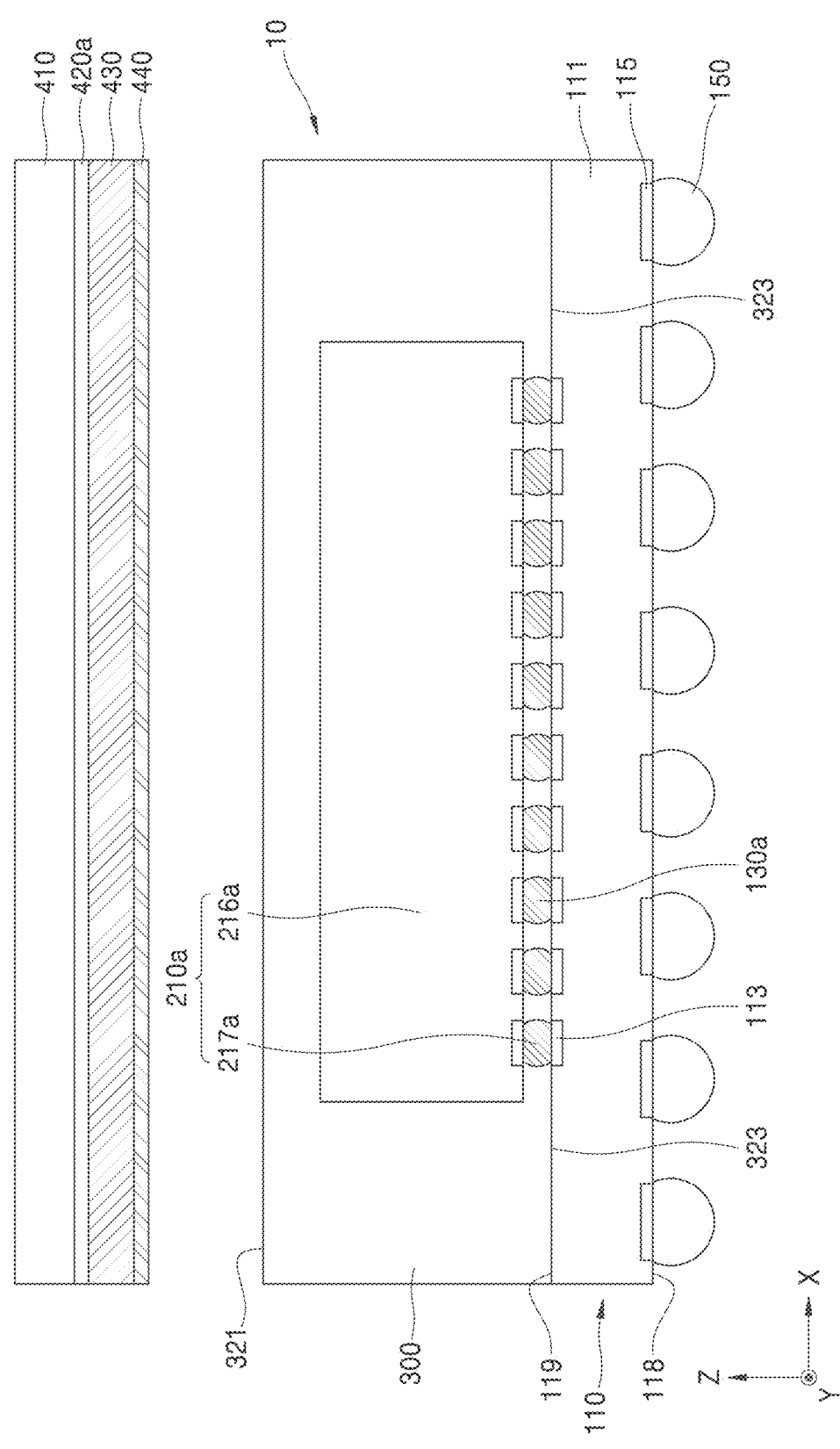
FIGS. 17 to 20 are cross-sectional views of sequential stages in the method.

Referring to FIGS. 16 and 17, the method of marking a semiconductor package may include preparing the semiconductor package 10 including the semiconductor chip 210a and the package molding layer 300 surrounding the semiconductor chip 210a in operation S210.

The top surface 321 of the package molding layer 300 may not be inclined in a diagonal direction and may have a flat (or substantially flat) shape that is parallel with the first horizontal direction (the X direction) and the second horizontal direction (the Y direction).

Figure 18:
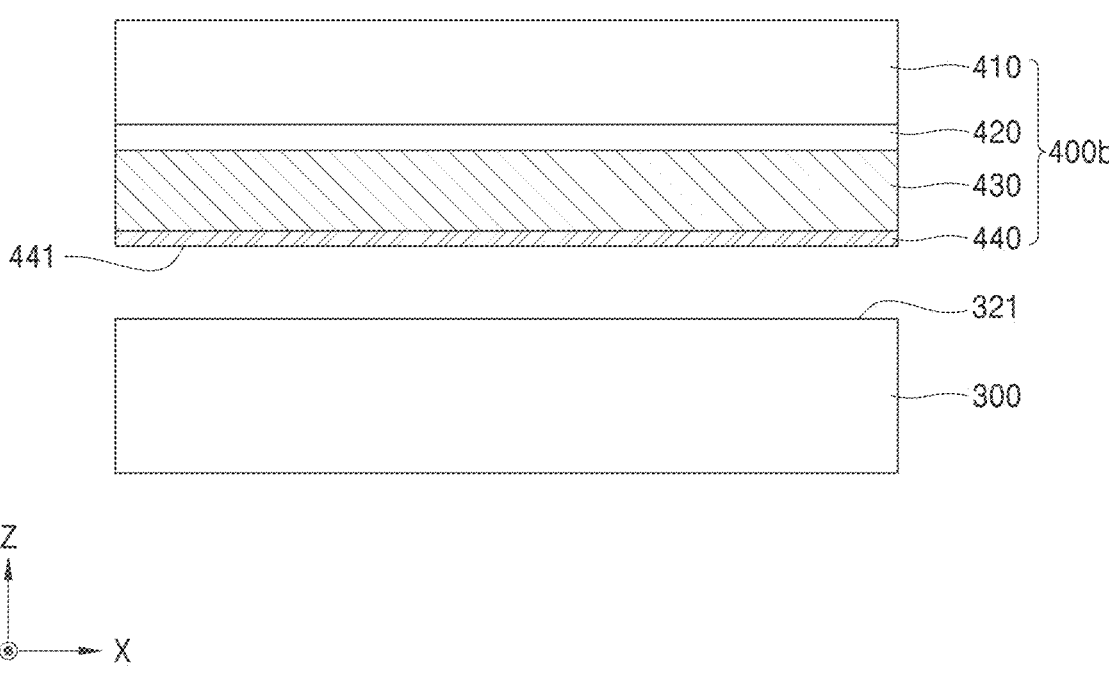

Referring to FIGS. 16 and 18, a dry sheet 400b, which includes the dry film 430, a first adhesive material 420a attached to a first surface of the dry film 430, a second adhesive material 440 attached to a second surface of the dry film 430 opposite to the first surface thereof, and the carrier substrate 410 attached to the first adhesive material 420a, may be located above the top surface 321 of the package molding layer 300 such that the second adhesive material 440 faces the package molding layer 300, in operation S220.

According to at least one embodiment, the dry sheet 400b may be aligned above the top surface 321 of the package molding layer 300. At this time, the dry sheet 400b may include the carrier substrate 410, the first adhesive material 420a, the dry film 430, and the second adhesive material 440, which are sequentially stacked in the vertical direction (the Z direction) toward the top surface 321 of the package molding layer 300. The first adhesive material 420a and the second adhesive material 440 may be relatively thin compared to the carrier substrate 410 and the dry film 430. The second adhesive material 440 may be conformally attached to the flat bottom surface of the dry film 430. The length of the second adhesive material 440 in a lateral direction may be the same as the length in the lateral direction of each of the package molding layer 300, the dry film 430, the first adhesive material 420a, and the carrier substrate 410. Here, the lateral direction may be parallel with the first horizontal direction (the X direction) and the second horizontal direction (the Y direction).

For example, when viewed from the vertical direction (the Z direction), the area of the top surface of the second adhesive material 440 may be the same as each of the area of the top surface 321 of the package molding layer 300, the area of the top surface of the carrier substrate 410, the area of the top surface of the first adhesive material 420a, and the area of the top surface of the dry film 430.

According to at least one embodiment, the first adhesive material 420a and the second adhesive material 440 may include components of generally used gluing agents or adhesives. For example, the first adhesive material 420a and the second adhesive material 440 may include at least one selected from the group consisting of epoxy, polyamide, acryl, and polyimide. For example, the first adhesive material 420a may include at least one selected from the group consisting of acryl, vinyl acetate, an ethylene-vinyl acetate copolymer, an ethylene-acrylic acid ester copolymer, polyamide polyethylene polysulfone, epoxy, polyimide, polyamic acid, a silicon phenol rubber polymer, flurororubber polymer, and fluororesin. The second adhesive material 440 may include a material, which has an adhesive strength increasing when the material is solidified after being liquefied by thermal energy.

Figure 19:
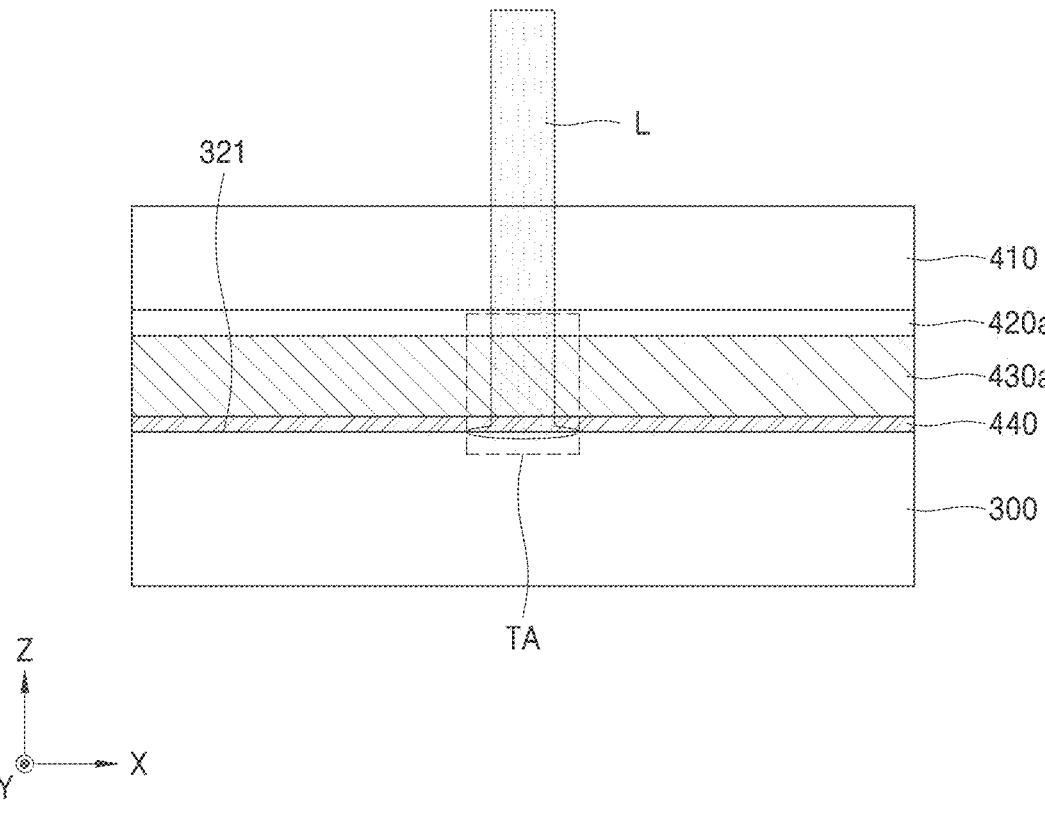

Referring to FIGS. 16 and 19, the second adhesive material 440 may be attached to the top surface of the package molding layer 300 in operation S230.

At this time, the bottom surface of the second adhesive material 440 may be coplanar with the top surface of the package molding layer 300. When the semiconductor package 10 includes the package molding layer 301 (see FIG. 6) having a vertical stack of two layers, the second adhesive material 440 may be attached to the top surface of the second molding layer 393 (see FIG. 6).

Figure 20:
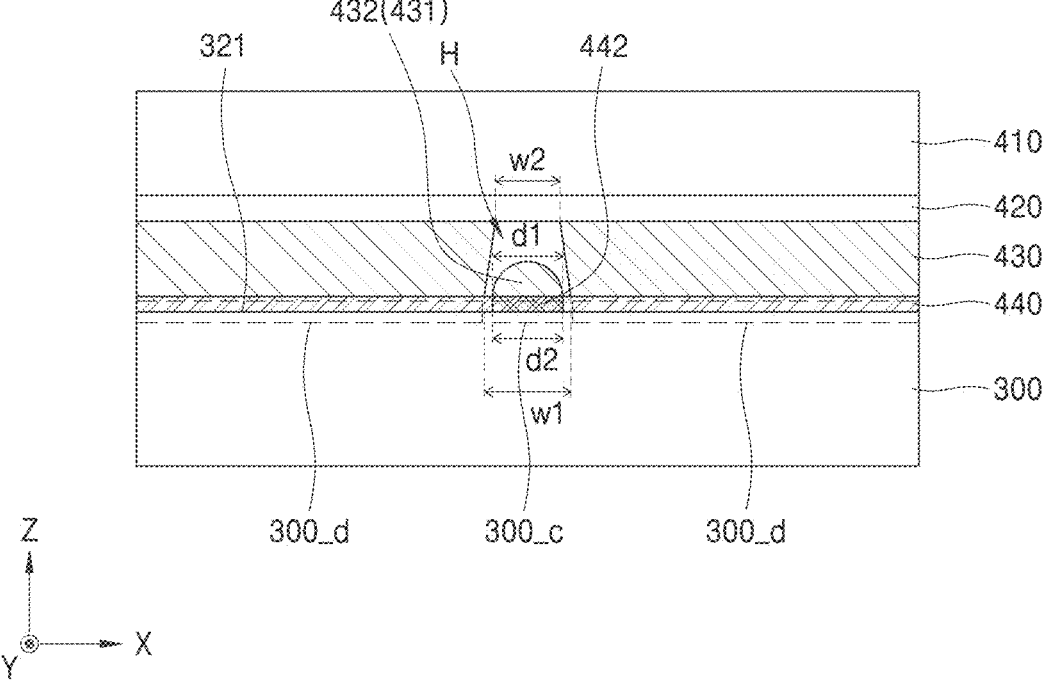

Referring to FIGS. 16, 19, and 20, a portion of the dry film 430 and a portion of the second adhesive material 440 between the portion of the dry film 430 and the top surface of the package molding layer 300 may be liquefied by radiating laser light L to the carrier substrate 410 in operation S240.

The laser light L may pass through the carrier substrate 410 and the first adhesive material 420a and may be radiated to the dry film 430 and the second adhesive material 440 on the package molding layer 300. The package molding layer 300 may include a target region TA. The laser light L may be radiated to the target region TA of the package molding layer 300. The target region TA may be an area that is targeted to form an ink spot 432 therein by liquefying the dry film 430 and form the adhesive layer 442 therein by liquefying the second adhesive material 440. Accordingly, a portion of the dry film 430, which overlaps the target region TA, and a portion of the second adhesive material 440, which overlaps the target region TA, may be irradiated with the laser light L. The area of the target region TA on the top surface of the package molding layer 300 may be smaller than the area of the remaining region excluding the target region TA on the top surface of the package molding layer 300.

According to at least one embodiment, the melting point of the first adhesive material 420a may be higher than the melting point of the dry film 430 and the melting point of the second adhesive material 440, and accordingly, the first adhesive material 420a may not be liquefied by the laser light L, and only the dry film 430 and the second adhesive material 440 may be liquefied by the laser light L.

According to at least one embodiment, as described above with reference to FIG. 12, in the process of forming the ink spot 432, a hole H may be formed in a portion of the dry film 430, wherein the hole may have a tapered shape having a width increasing toward the package molding layer 300. The detailed description of the shape of the hole H has been made above with reference to FIG. 12 and is thus omitted below.

Referring to FIGS. 16 and 20, the ink marking pattern 431 may be formed by solidifying the ink spot 432, which is the liquefied portion of the dry film 430, in operation S250.

The ink spot 432 in FIG. 20 is substantially the same as the ink spot 432 described with reference to FIG. 12, and thus, detailed descriptions thereof are omitted.

Referring to FIGS. 16 and 20, the adhesive layer 442 may be formed by solidifying the liquefied portion of the second adhesive material 440 in operation S260. Thereafter, the remaining portion of the dry film 430 that has not been liquefied and the remaining portion of the second adhesive material 440 that has not been liquefied may be removed from the top surface of the package molding layer 300 in operation S270.

The adhesive layer 442 may be between the ink spot 432 and the package molding layer 300. At this time, the ink spot 432 having a hemispherical shape may have a first length d1 as the diameter thereof and the adhesive layer 442 may have a second length d2 as the diameter thereof. The first length d1 of the ink spot 432 may be substantially the same as the second length d2 of the adhesive layer 442. Accordingly, the adhesive layer 442 may completely overlap the ink spot 432 when viewed in the plan view. When viewed in the plan view, the adhesive layer 442 may have a circular shape like the ink spot 432.

The ink spot 432 may shrink during the solidification thereof. At this time, the ink spot 432 forming the ink marking pattern 431 may have the hemispherical shape due to the shrinkage. The detailed description of the shape of the ink spot 432 has been made above with reference to FIG. 12 and is thus omitted below.

According to at least one embodiment, the package molding layer 300 may include a first region 300_c, which includes a portion in which the ink spot 432 forming the ink marking pattern 431 is formed, and a second region 300_d, which surrounds the first region 300_c and in which the ink marking pattern 431 is not formed. The adhesive layer 442 may be attached to the first region 321_c of the package molding layer 300. The ink spot 432 having the hemispherical shape may be attached to the adhesive layer 442. The adhesive layer 442 in FIG. 20 may be substantially the same as the adhesive layer 442 in FIG. 3C.

After the adhesive layer 442 is formed, the remaining portion of the dry film 430 that has not been liquefied and the remaining portion of the second adhesive material 440 that has not been liquefied may be removed from the top surface of the package molding layer 300, as shown in FIG. 13.

While the inventive concepts have been particularly shown and described with reference to embodiments thereof, it will be understood that various changes in form and details may be made therein without departing from the spirit and scope of the following claims.

What is claimed is:

1. A method of marking a semiconductor package, the semiconductor package including a semiconductor chip and a package molding layer surrounding the semiconductor chip, the method comprising:

attaching, using a carrier substrate, a dry film to a top surface of the package molding layer;

forming an ink spot by radiating laser light to the carrier substrate such that a portion of the dry film is liquefied;

forming an ink marking pattern by solidifying the ink spot corresponding to the liquefied portion of the dry film; and removing a remaining portion of the dry film from the top surface of the package molding layer, the remaining portion of the dry film having not been liquefied, wherein the ink marking pattern includes at least one of information about storage capacity or information for identifying a producer of a product.

2. The method of claim 1, wherein the ink marking pattern has a hemispherical shape resulting from shrinkage of the ink spot during the solidifying of the ink marking pattern.

3. The method of claim 1, wherein the forming of the ink spot includes forming a hole in the dry film, the hole having a tapered shape having a width increasing toward the package molding layer.

4. The method of claim 3, wherein a bottom of the hole has a first width, and the ink spot has a diameter that is less than the first width.

5. The method of claim 1, further comprising:

increasing a surface roughness of the package molding layer, before the attaching of the dry film to the top surface of the package molding layer, by performing a plasma treatment on the top surface of the package molding layer.

6. The method of claim 1, wherein, in the forming of the ink marking pattern, the top surface of the package molding layer includes a first region and a second region, the first region has the ink marking pattern formed therein, the second region surrounds the first region and does not have the ink marking pattern therein, and a surface roughness of the first region is higher than a surface roughness of the second region.

7. The method of claim 1, wherein the carrier substrate includes a transparent material.

8. The method of claim 1, wherein, in the attaching of the dry film to the top surface of the package molding layer, the package molding layer includes a first molding layer on a package substrate and a second molding layer on the first molding layer, the second molding layer includes at least one of a photosensitive material and a thermosensitive material, and the dry film is attached to a top surface of the second molding layer in the attaching of the dry film to the top surface of the package molding layer.

9. The method of claim 1, wherein a color of the ink marking pattern is different from a color of the package molding layer.

10. The method of claim 1, wherein, in the forming of the ink marking pattern, the top surface of the package molding layer includes a first region and a second region, the first region has the ink marking pattern formed therein, the second region surrounds the first region and does not have the ink marking pattern therein, and a top surface of the first region is coplanar with a top surface of the second region.

11. The method of claim 1, wherein, in the forming of the ink spot by liquefying the portion of the dry film the top surface of the package molding layer includes a target region when viewed in a plan view, and a portion of the dry film overlapping the target region is irradiated with the laser light.

12. The method of claim 11, wherein an area of the target region is less than an area of a remaining region of the top surface of the package molding layer excluding the target region.

13. The method of claim 1, wherein, in the forming of the ink spot by liquefying the portion of the dry film, the top surface of the package molding layer includes a target region when viewed in a plan view, and a remaining portion of the dry film, excluding a portion of the dry film overlapping the target region, is irradiated with the laser light.

14. A method of marking a semiconductor package including a semiconductor chip and a package molding layer surrounding the semiconductor chip, the method comprising:

aligning a dry sheet above a top surface of the package molding layer, the dry sheet including a dry film, a first adhesive material attached to a first surface of the dry film and to a carrier substrate, and a second adhesive material attached to a second surface of the dry film opposite to the first surface of the dry film and facing the package molding layer;

attaching the second adhesive material to the top surface of the package molding layer;

liquefying a portion of the dry film and a portion of the second adhesive material by radiating laser light to the carrier substrate, the portion of the second adhesive material being between the portion of the dry film and the top surface of the package molding layer;

forming an ink marking pattern by solidifying an ink spot corresponding to the liquefied portion of the dry film;

forming an adhesive layer by solidifying the liquefied portion of the second adhesive material; and removing a remaining portion of the dry film and a remaining portion of the second adhesive material from the top surface of the package molding layer, the remaining portion of each of the dry film and the second adhesive material having not been liquefied, wherein the ink marking pattern includes at least one of information about storage capacity or information for identifying a producer of a product.

15. The method of claim 14, wherein, in the liquefying of the portion of the second adhesive material, the first adhesive material has a melting point that is higher than a melting point of the second adhesive material such that the first adhesive material is not liquefied by the laser light during the liquefying of the portion of the second adhesive material.

16. The method of claim 14, wherein, in the forming of the adhesive layer by solidifying the liquefied portion of the second adhesive material, the adhesive layer overlaps the ink spot when viewed in a plan view.

17. The method of claim 14, wherein the top surface of the package molding layer is flat and without a step.

18. A method of marking a semiconductor package including a semiconductor chip and a package molding layer surrounding the semiconductor chip, the method comprising:

aligning a dry sheet above a top surface of the package molding layer, the dry sheet including a dry film and an adhesive material attaching the dry film to a carrier substrate;

attaching the dry film to the top surface of the package molding layer;

forming a hole in the dry film by radiating laser light to the carrier substrate such that a target region of the dry film is liquified, the hole having a tapered shape having a width increasing toward the package molding layer;

forming an ink marking pattern, including ink spots having a hemispherical shape, by solidifying the liquefied portion of the dry film; and removing a remaining portion of the dry film from the top surface of the package molding layer, the remaining portion of the dry film having not been liquefied, wherein a bottom of the hole has a first width and the ink marking pattern has a diameter that is less than the first width, and the ink marking pattern includes at least one of information about storage capacity or information for identifying a producer of a product.

19. The method of claim 18, wherein, in the forming of the ink marking pattern, the remaining portion of the dry film having not been liquefied is spaced apart from the ink spots.

20. The method of claim 18, wherein, in the forming of the ink marking pattern including the ink spots having the hemispherical shape by solidifying the liquefied portion of the dry film, a surface roughness of a portion of the package molding layer in contact with the ink spots is higher than a surface roughness of a portion of the package molding layer not in contact with the ink spots.

\* \* \* \* \*